(12) United States Patent
Horvath et al.

(10) Patent No.: US 12,147,002 B2
(45) Date of Patent: Nov. 19, 2024

(54) FAST NEUTRON DETECTOR

(71) Applicant: Fusion Energy Solutions, Inc., Tempe, AZ (US)

(72) Inventors: Ian Shawn Horvath, Phoenix, AZ (US); Yiyang Li, Tempe, AZ (US); Charles Edwin Runyan, Tempe, AZ (US); Clinton Hughes, Tempe, AZ (US)

(73) Assignee: Fusion Energy Solutions, Inc., Tempe, AZ (US)

( * ) Notice: Subject to any disclaimer, the term of this patent is extended or adjusted under 35 U.S.C. 154(b) by 0 days.

(21) Appl. No.: 17/146,292

(22) Filed: Jan. 11, 2021

(65) Prior Publication Data

US 2023/0016402 A1 Jan. 19, 2023

Related U.S. Application Data

(60) Provisional application No. 62/970,392, filed on Feb. 5, 2020, provisional application No. 62/970,061, filed on Feb. 4, 2020, provisional application No. 62/963,365, filed on Jan. 20, 2020, provisional application No. 62/960,492, filed on Jan. 13, 2020, provisional application No. 62/960,481, filed on Jan. 13, 2020, provisional application No. 62/959,633, filed on Jan. 10, 2020.

(51) Int. Cl.
*G01T 3/08* (2006.01)
*H01L 31/0735* (2012.01)

(52) U.S. Cl.
CPC ............ *G01T 3/08* (2013.01); *H01L 31/0735* (2013.01)

(58) Field of Classification Search
CPC ................. G01T 3/08; H01L 3/0735
See application file for complete search history.

(56) References Cited

U.S. PATENT DOCUMENTS

| | | | | |
|---|---|---|---|---|
| 4,163,240 A * | 7/1979 | Swinehart | ................ | G01T 3/08 |
| | | | | 250/370.07 |
| 5,029,262 A * | 7/1991 | Schulte | ..................... | G01T 3/08 |
| | | | | 250/370.06 |
| 6,479,826 B1 * | 11/2002 | Klann | ..................... | G01T 3/08 |
| | | | | 250/370.04 |
| 7,394,187 B2 * | 7/2008 | White | ..................... | H01J 43/22 |
| | | | | 313/379 |
| 11,063,162 B2 * | 7/2021 | Holmes | ................ | H01L 31/028 |
| 2005/0224719 A1 * | 10/2005 | Polichar | ................... | G01T 3/06 |
| | | | | 250/390.01 |
| 2006/0163487 A1 * | 7/2006 | Ambrosi | .................. | G01T 3/00 |
| | | | | 250/390.01 |

(Continued)

*Primary Examiner* — Hugh Maupin
(74) *Attorney, Agent, or Firm* — Wolf, Greenfield & Sacks, P.C.

(57) ABSTRACT

Fast neutron detectors using nuclear reactions within semiconductor material, glass, or other material. Some versions used doped versions of the materials. Some versions use dopants selected from Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr. Some versions have filters or coatings deposited on windows into the detector. Coatings are selected from titanium oxide, zinc oxide, tin oxide, copper indium gadolinium selenide, cadmium telluride, cadmium tin oxide, perovskite photovoltaic, Si, GaAs, AlP, Ge.

8 Claims, 14 Drawing Sheets

(56) References Cited

U.S. PATENT DOCUMENTS

Figure 1A:
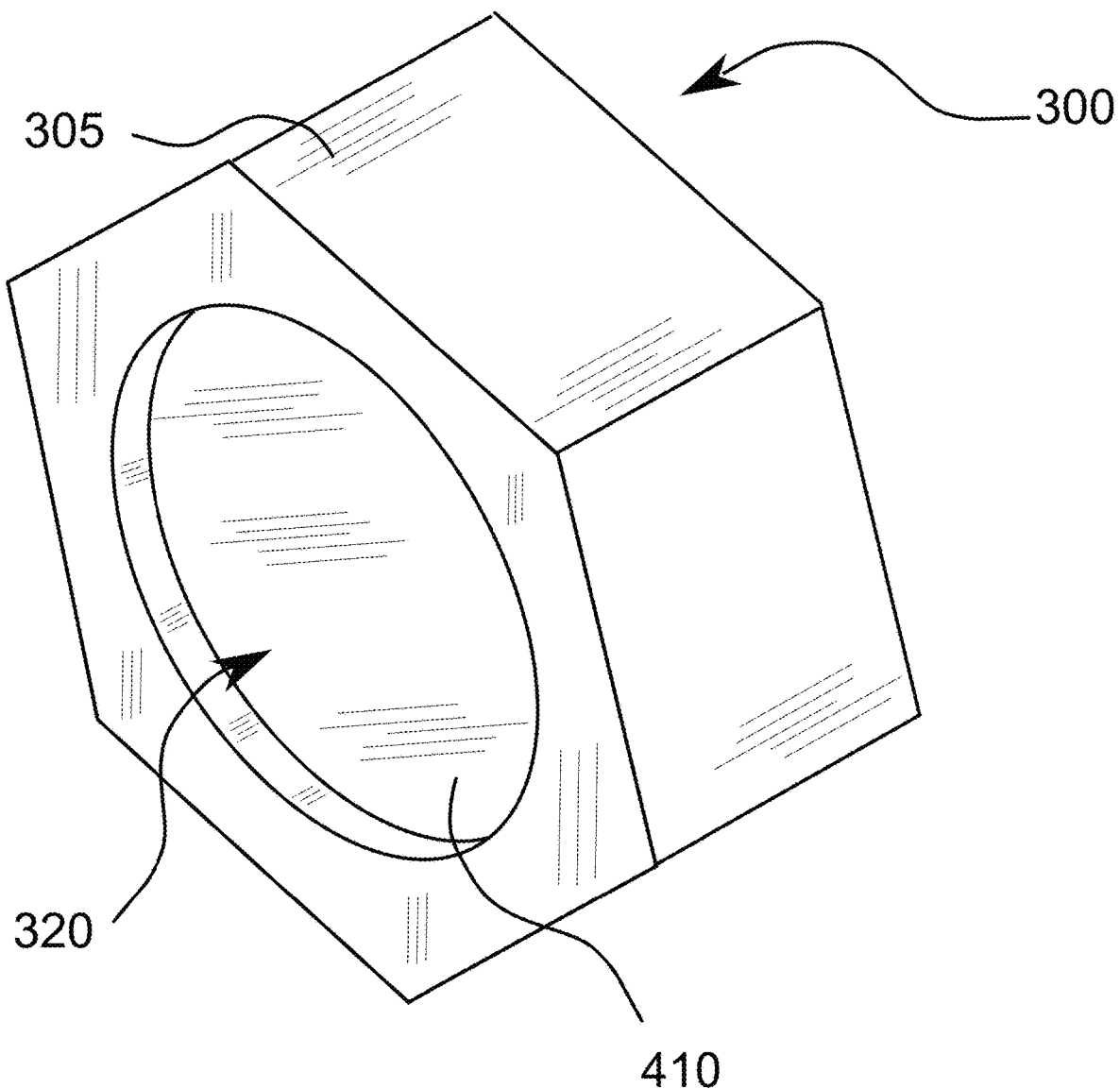

| | | | | |
|---|---|---|---|---|
| 2006/0255282 A1* | 11/2006 | Nikolic | .................... | G01T 3/08 |
| | | | | 250/390.01 |
| 2009/0179542 A1* | 7/2009 | Downing | ................ | H01J 9/125 |
| | | | | 445/35 |
| 2011/0127527 A1* | 6/2011 | Kub | ......................... | G01T 3/08 |
| | | | | 257/E31.086 |
| 2013/0240741 A1* | 9/2013 | Imholt | .................... | G01T 3/003 |
| | | | | 250/361 R |
| 2014/0264057 A1* | 9/2014 | Cress | ....................... | G01T 3/08 |
| | | | | 250/390.11 |
| 2015/0001401 A1* | 1/2015 | Ramsden | ................. | G01T 3/06 |
| | | | | 250/361 R |
| 2015/0276947 A1* | 10/2015 | Hoenk | ............. | H01L 27/14685 |
| | | | | 250/369 |

* cited by examiner providing a detector,
210 receiving fast neutrons,
215 generating a signal proportional to neutron flux,
220

FAST NEUTRON DETECTOR

CROSS-REFERENCE TO RELATED APPLICATIONS

This application is related to and claims priority to U.S. Provisional Patent Application No., all of which are incorporated by reference:
62/959,633, filed on Jan. 10, 2020
62/960,481, filed on Jan. 13, 2020
62/960,492, filed on Jan. 13, 2020
62/963,365, filed on Jan. 20, 2020
62/970,061, filed on Feb. 4, 2020
62/970,392, filed on Feb. 5, 2020

BACKGROUND

PIPS

Standard PIPS detectors have been employed for years, quantifying charged reaction particles from nuclear reactions. PIPS detectors use the photovoltaic effect to count the number of charged particles during rated when radiation enters the detector. The particle (light ray) enters the detector and transfers some of its energy into the electrons of the detector substrate material. In this case to silicon. A key feature of PIPS detectors is that the detector responds to charged particles. The particles pass through the detector and generate mobile pairs of electrons and holes in the semiconductor substrate. Consequently, PIPS arrangements are ill-suited for detecting neutral particles, for example, neutrons.

Silicon Photomultiplier detectors (SiPM) are well known. An incoming photon generates an avalanche of charge carriers. This avalanche creates a measurable current proportional to the number of fast neutrons.

SiPM comprise a Si substrate that is sensitive to incoming photons. But the detector is also sensitive to photons generated inside the detector.

An incoming neutron will sometimes collide with a Si atom and that collision generates a quantity of photons proportional to the number flux of incoming neutrons. And the SiPM is to those photons.

Fiberoptic

Fiberoptic cables contain long fibers of glass: essentially silica. These fibers have been designed to transmit photons and part of the transmission process is detecting those photons as they exit the fiberoptic cable.

Penetration of neutrons into the fiber produces neutrons colliding with the silicon of the silica. These collisions generate photons within the optical fibers. Photons generated in the optical fibers of the fiberoptic cable will travel through the glass and then be detected.

Photodiodes

Photodiodes are diodes that conduct electricity when exposed to light. The silicon in the diode can interact with incoming neutrons, again generating photons that the photodiodes can detect.

FIGURES

FIG. 1A depicts a perspective view of prior art PIPS detector.

Figure 1B:
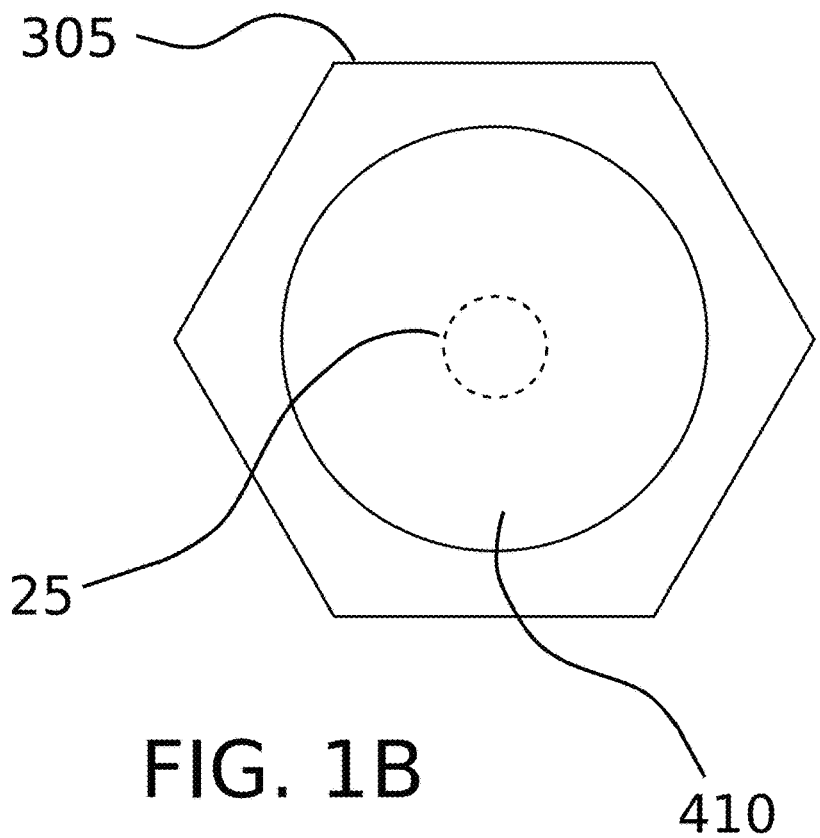
Figure 1C:
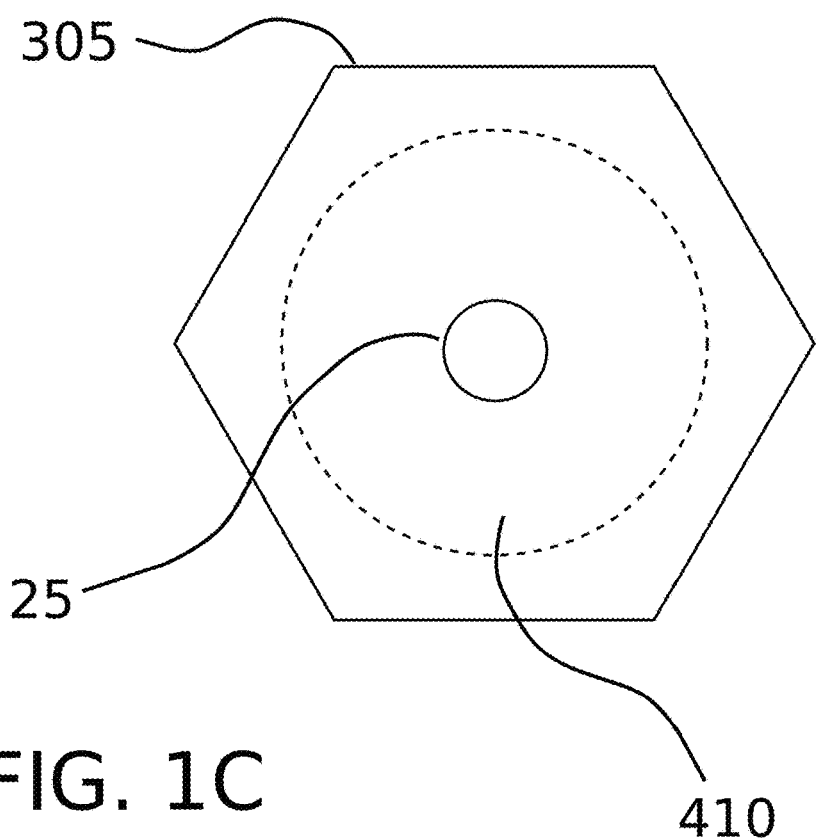
Figure 2:
Figure 2:
Figure 3:
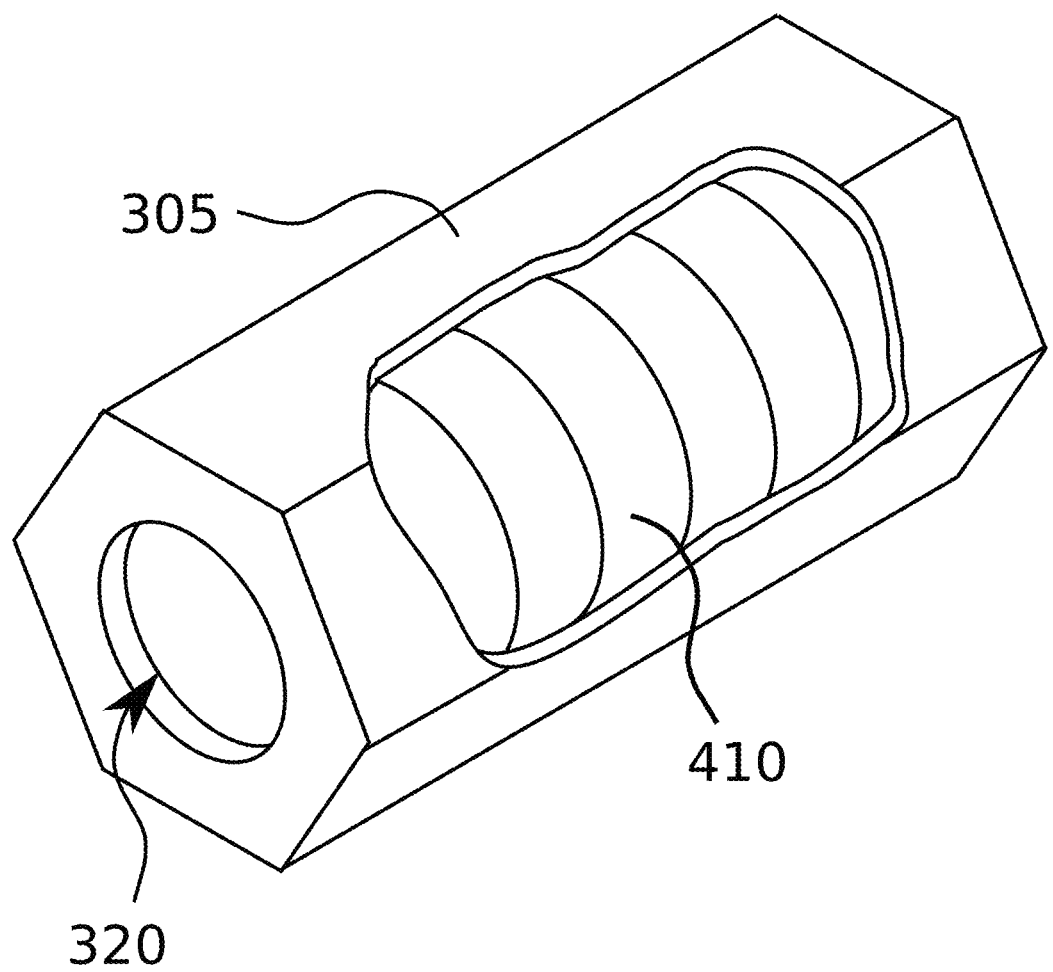
Figure 4A:
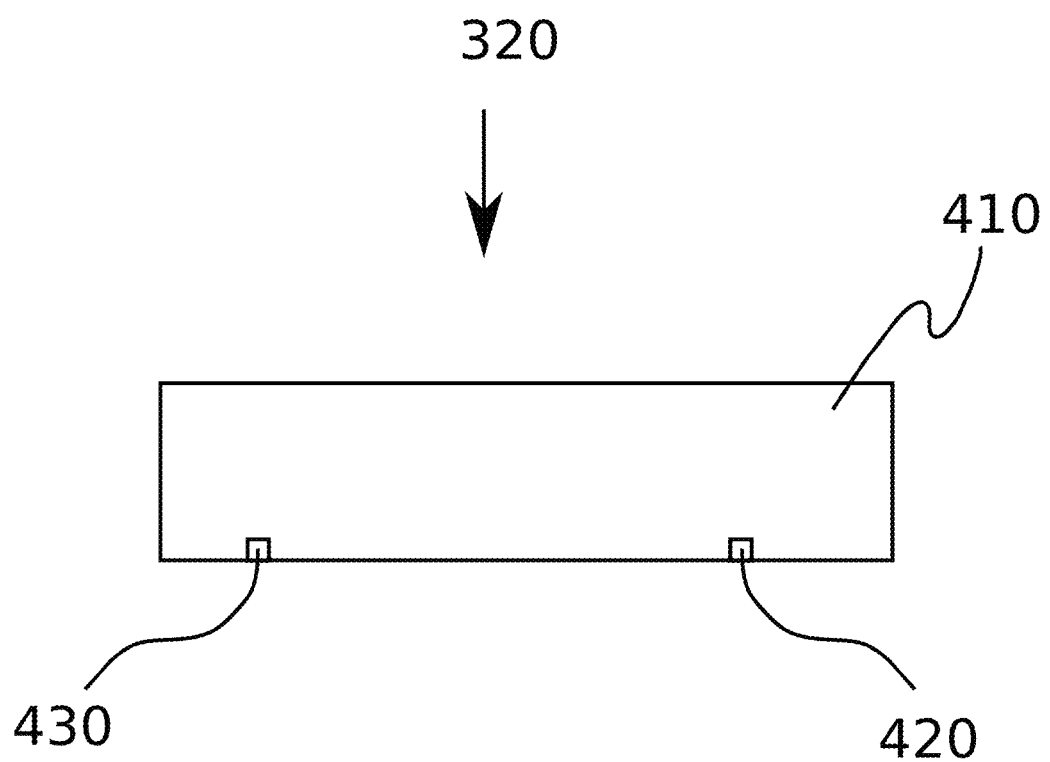
Figure 4B:
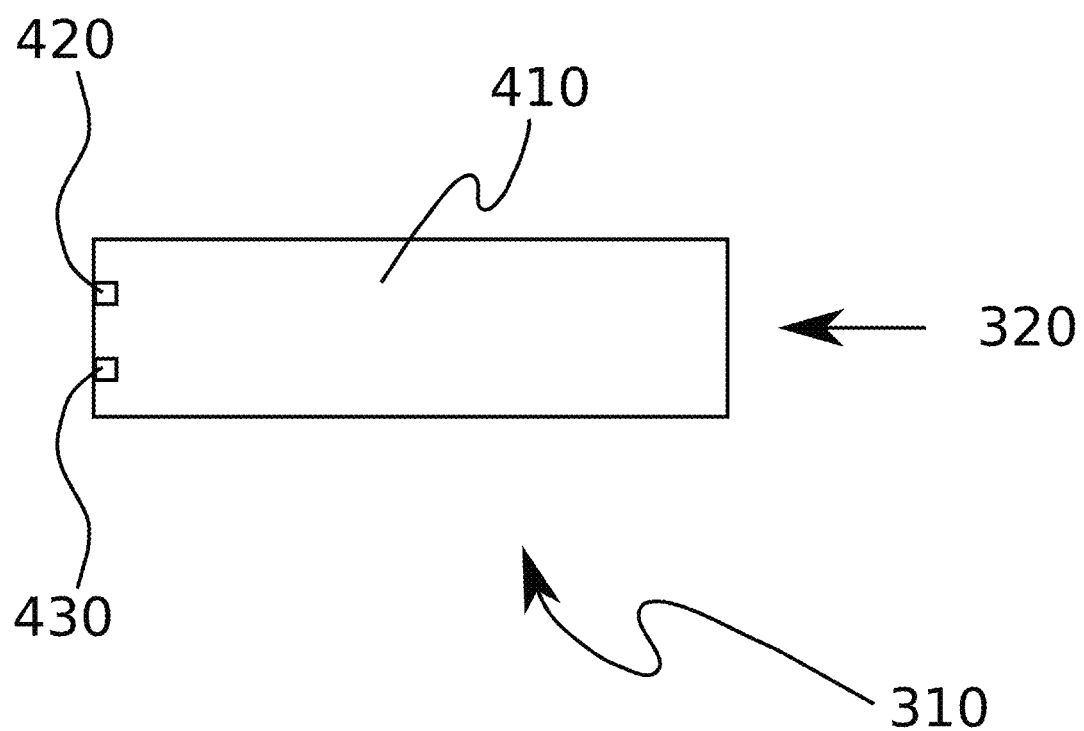
Figure 5:
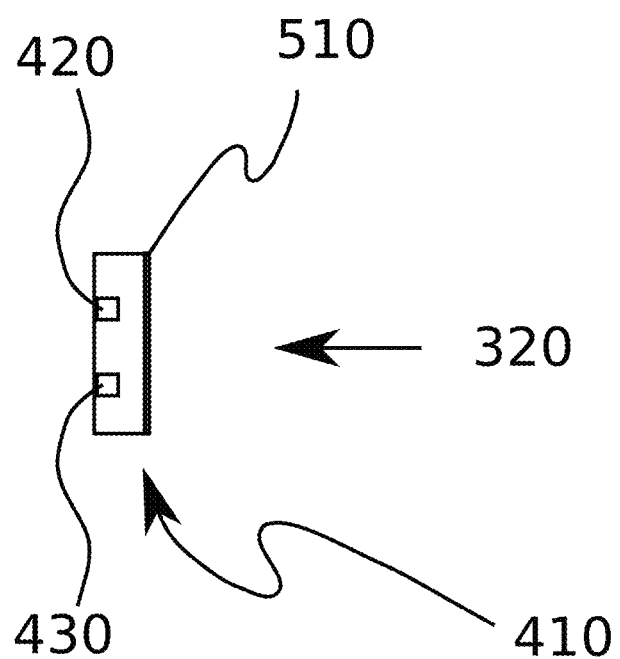
Figure 6A:
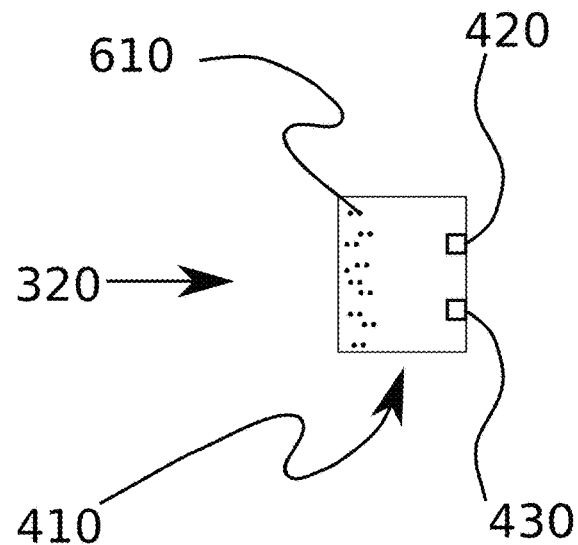
Figure 6B:
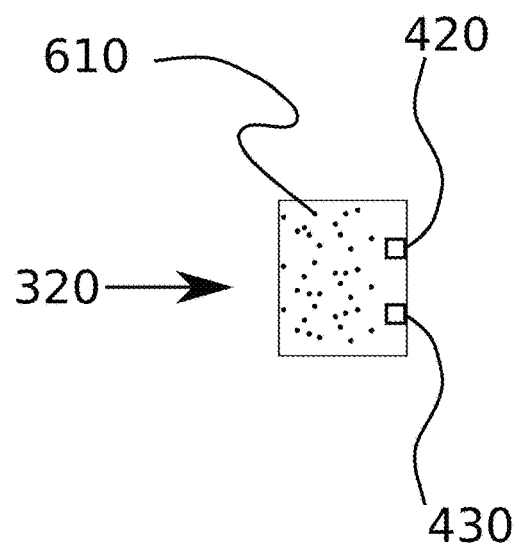
Figure 7:
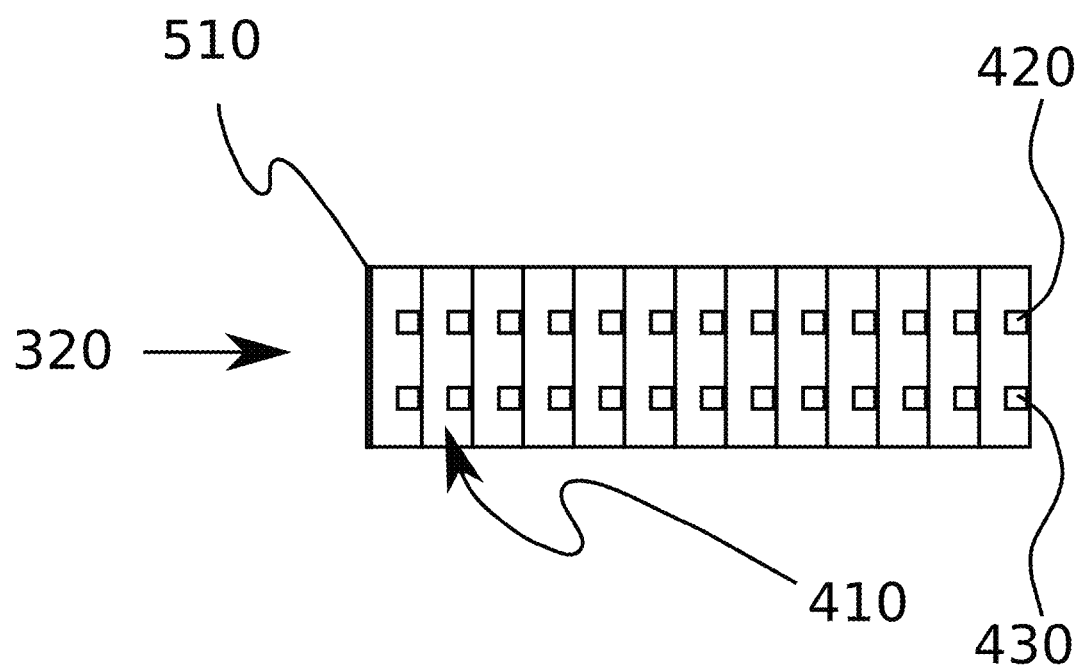
Figure 8:
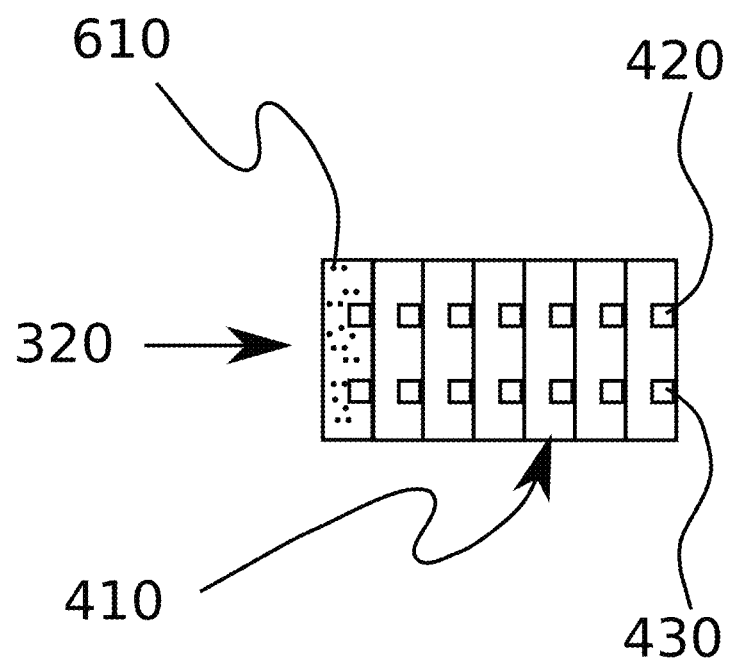
Figure 9A:
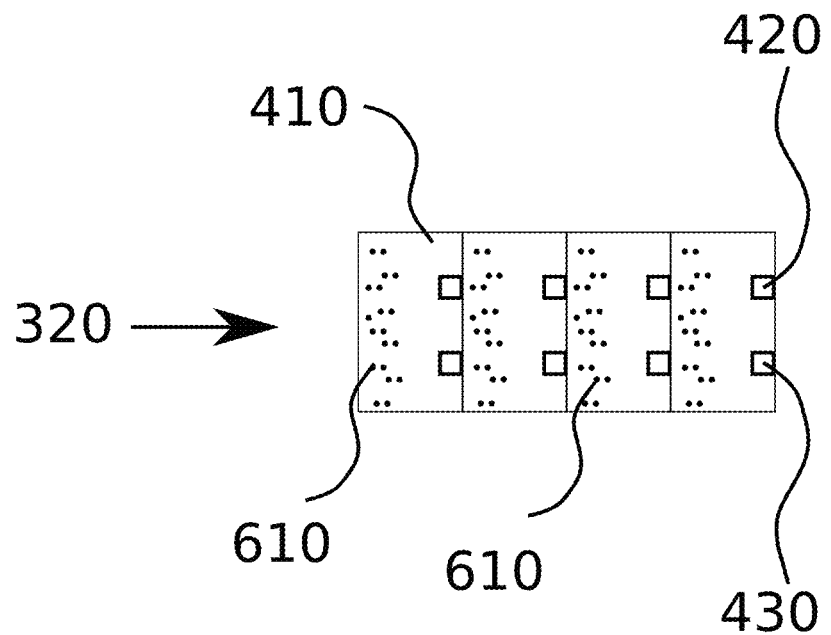
Figure 9B:
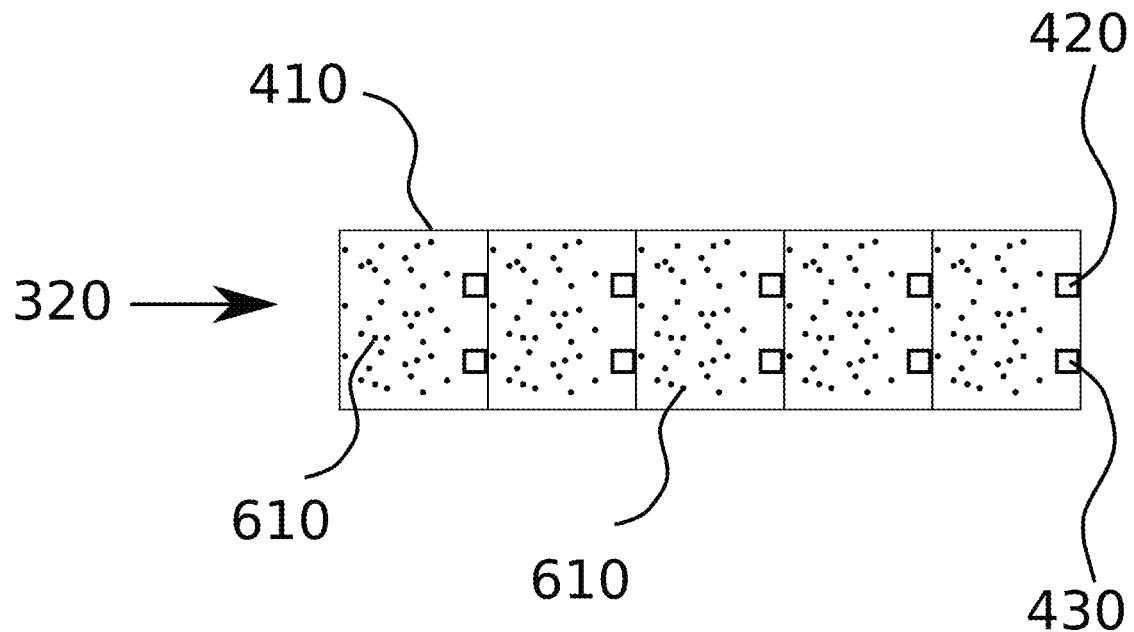
Figure 10:
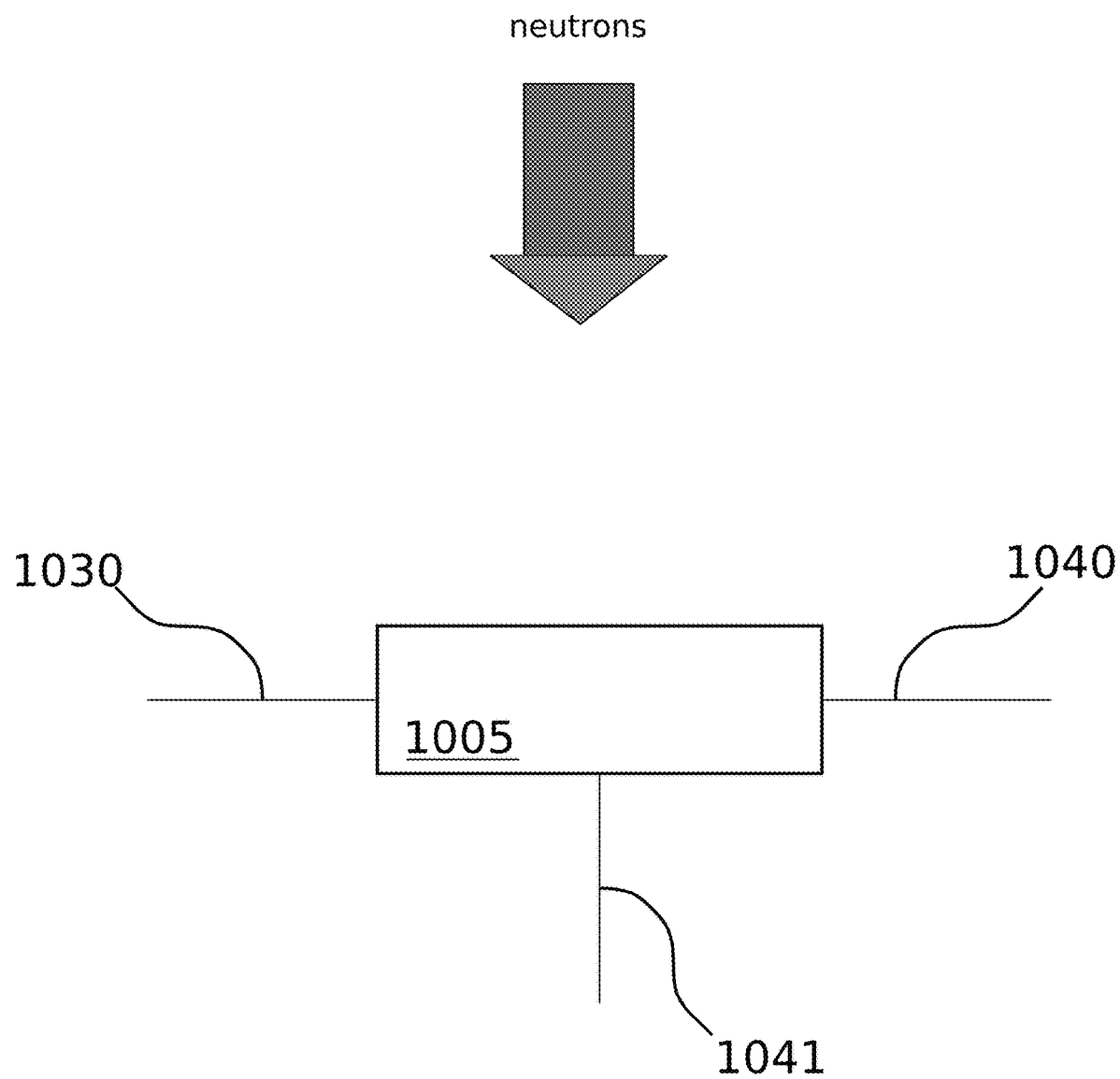
Figure 11:
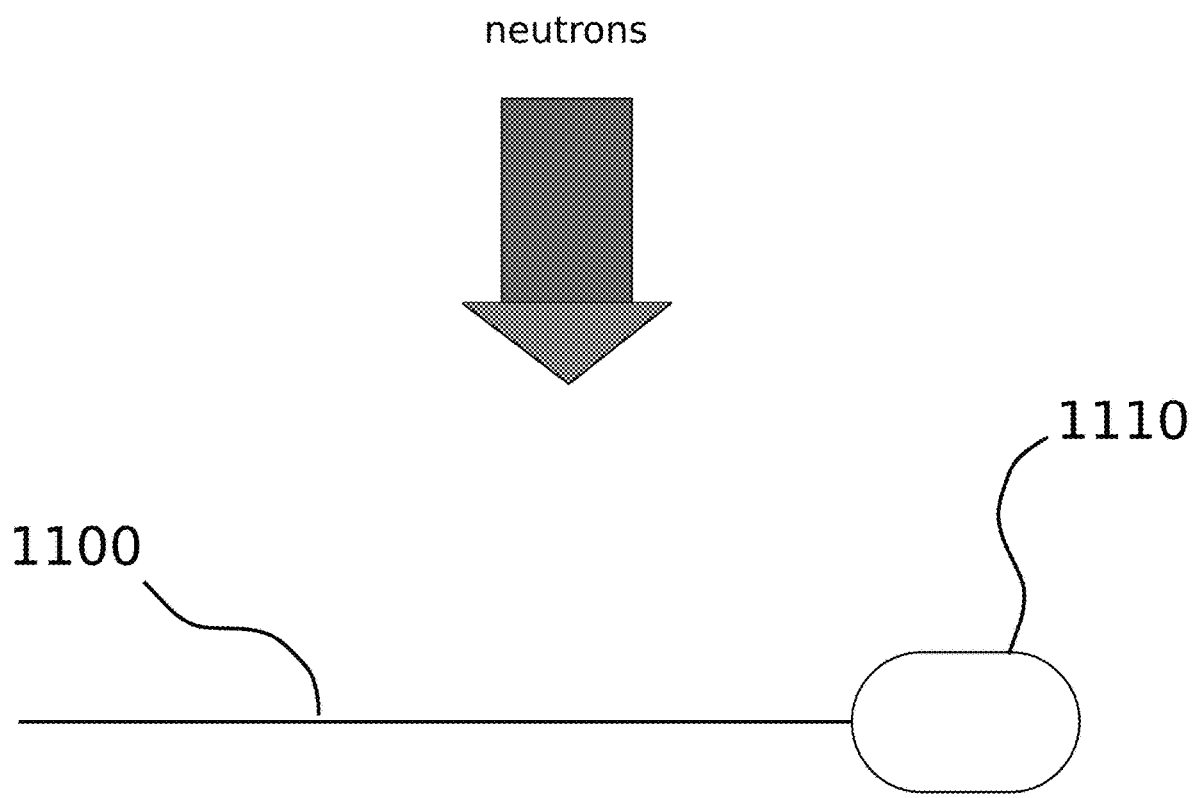
Figure 12:
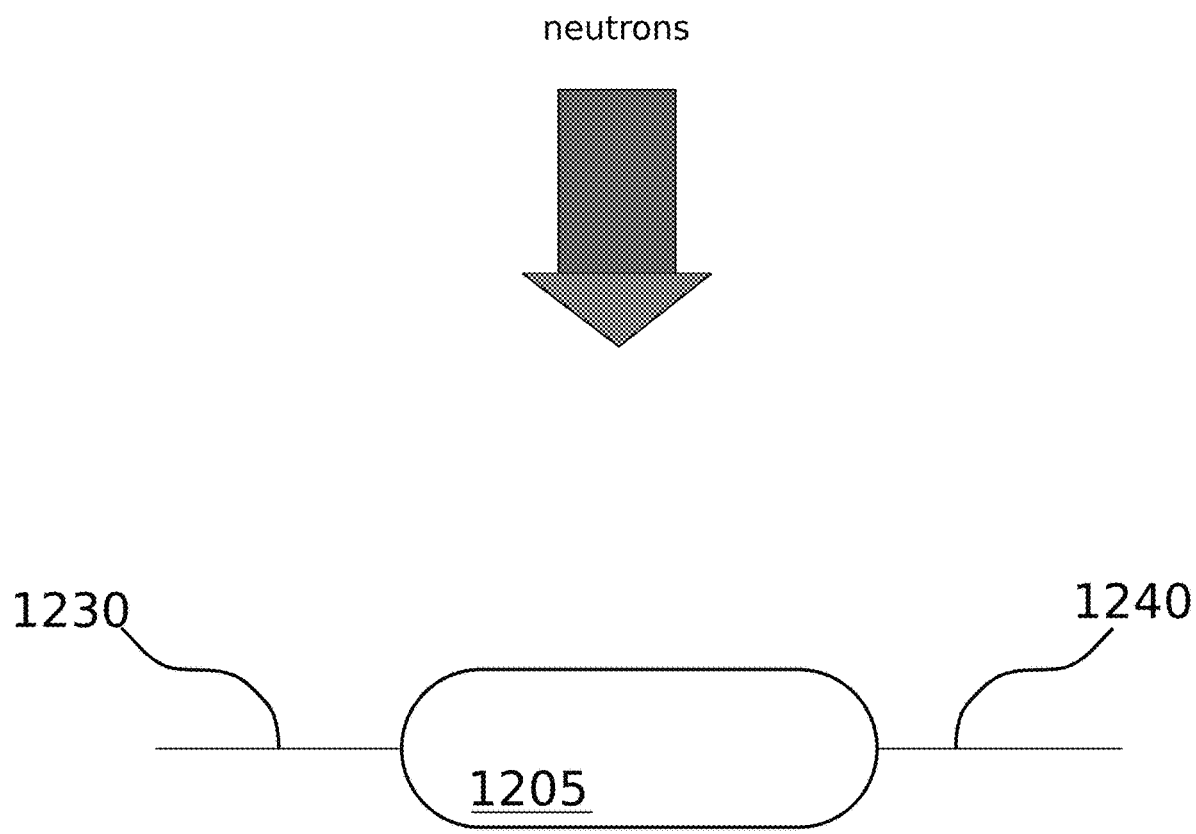

FIG. 1B is a different view of the detector FIG. 1A.
FIG. 1C is a back view of the detector of FIG. 1A.
FIG. 2 illustrates a method of using a detector.
FIG. 3 is a prospective view of a PIPS detector according to an embodiment of the invention.
FIG. 4A is a schematic view of the PIPS substrate.
FIG. 4B depicts a side view of the PIPS substrate
FIG. 5 depicts a side view of the PIPS substrate according to an alternative version of modified PIPS substrate.
FIG. 6A depicts a side view of the PIPS substrate according to another version of modified PIPS substrate.
FIG. 6B depicts a side view of the PIPS substrate according to another version of modified PIPS substrate.
FIG. 7 depict a side view of the PIPS substrate according to an alternative embodiment of an inventive PIPS substrate.
FIG. 8 depicts a side view of the PIPS substrate according to an alternative embodiment of an inventive PIPS substrate.
FIG. 9A depicts a side view of the PIPS substrate according to an alternative embodiment of an inventive PIPS substrate.
FIG. 9B depicts a side view of the PIPS substrate according to an alternative embodiment of an inventive PIPS substrate.
FIG. 10 depicts a schematic view of a silicon photomultiplier.
FIG. 11 depicts a schematic view of a fiber optic detector.
FIG. 12 depicts a schematic view of a Silicon photodiode detector.

DETAILED DESCRIPTION connector 25
PIPS detector case 305
detector window 320
semiconductor substrate 410
electrodes 420, 430
coating 510
dopant 610

The detector element of invention detectors is an element that reacts with incoming neutrons. For instance, Si 28 facilely interacts with neutrons. This reaction yields any number of products, such as gamma rays or charged particles. These particles interact with the detector in a typical fashion. Thus, the nuclear reaction of an incoming neutron with the detector substrate creates products that the detector was designed to detect. Nonetheless, modification of the detector provides the ability to detect neutral particles more optimally, while substantially retaining the cost benefits that detectors typically provide. That is, detectors can be modified to measure the reaction products of an impinging neutron and hence indirectly quantitatively measure the number of impinging neutrons.

FIG. 1A depicts a PIPS detector. The figure shows detector case 305, window 320, and silicon substrate 410. FIG. 1B represents a view of the detector looking down onto the window. FIG. 1C represents a view of the detector looking at the back of the detector. Element 320 indicates a window to the detector. This is where the neutrons enter the detector. In FIGS. 1B and 1C component 25 represents an electrical connection on the back of the detector, which contains two electrodes not shown in this figure.

FIG. 2 represents a method of measuring fast neutrons. The first step is providing 210 a detector that has a substrate that is capable of nuclearly reacting with an income neutron. Either the bulk substrate of the detector or a coating on the detector or a dopant element implanted into the detector substrate should exhibit this nuclear reactivity. The next step is to place the detector where it can receive 215 neutrons or fast neutrons through window 320. As discussed above, the nuclear reaction generates gamma rays, among other nuclear particles, which the detector can sense. Another step is the step of generating 220 a signal proportional to the incoming neutron flux or number of neutrons.

FIG. 3 depicts a detector. Detector case 305 surrounds a stack of semiconductor layers 410. The radiation that is to be measured, such as a neutron flux, enters through detector window 320. The incoming neutrons react with the semiconductor layer, sometimes silicon 28, and generates observable signals.

FIG. 4A is a PIPS detector depicted in schematic format. It shows window 320, substrate 410, and electrodes 420, 430. The incoming neutrons enter the detector through window 320.

FIG. 4B depicts a detector like that of FIG. 4A. It shows window 320, substrate 410, and electrodes 420, 430. In this version, Si substrate 410 is thicker or deeper. Being thicker, this version of the detector provides more opportunities for the to interact with the silicon 28.

FIG. 5 depicts a standard PIPS detector with substrate 410, window 320, and electrodes 420, 430. Additionally, it contains a coating 510, which coating 510 serves a variety of functions including filtering out neutrons with energies not relevant to the experiment or measurement. Additionally, the coating can interact with to produce reactants that have different energies than the silicon 28.

FIGS. 6A and 6B depict PIPS detector with window 320, substrate 410, and electrodes 420,430. Additionally, these figures depict a dopant atom or element 610. FIG. 6A illustrates that dopant 610 is concentrated near the surface of detector window 320. In FIG. 6B, dopant 610 is spread throughout substrate 410.

The dopant atoms, or the nuclear reactive components of the coating, can be chosen from elements with a moderate to high cross-section for neutron absorption. In some versions, these items are chosen so that the reaction with a neutron yields nuclear particles other than neutrons. Sometimes the element reacts with the neutron to yield gamma rays. Appropriate choice of dopant element or a coating component adjusts the energy or energy range that the detector is sensitive to.

Dopants can be selected from any one or any combination of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr.

FIG. 7 depicts a detector with a stack of individual semiconductor substrate 410 layers where each of substrate 410 have functional electrodes 420, 430. Detector electrodes connect to supporting electronics, such as amplifiers, preamplifiers, etc. The figure depicts window 320 and coating 510, as described above.

FIG. 8 depicts a detector like that shown in FIG. 7 with dopant 610 located in the topmost substrate layer 410.

FIG. 9A depicts a stacked detector showing electrodes 420, 430. It also shows a stack of substrate 410 and window 320. In this case, dopant 610 is in a top layer of the substrate 410 in two or more individual layers of substrate 410.

FIG. 9B shows a detector that is like the detector of FIG. 9A. It depicts a stacked detector showing electrodes 420, 430. It also shows a stack of substrate 410 and window 320. In this case, dopant 610 is spread throughout the substrate 410 in two or more individual layers of substrate 410.

FIG. 10 depicts a schematic view of an SiPM 1005 arranged to detect a neutron flux. SiPM 1005 has electrodes 1030, 1040 for applying a bias or operating voltage. Contact 1041 is an output contact. This contact connects to an amplifier for detecting the signal generated by SiPM. In incoming neutron interacts with silicon 28 contained in the SiPM generating gamma rays or other reactants that eventually create pairs, and the SiPM multiplies that signal.

FIG. 11 depicts a schematic view of the fiberoptic detector 1105. Fiber 1120 connects to transceiver 1110. Incoming neutrals react with the silicon contained in the silicon dioxide or silica of the glass in the fiber. The reaction produces gamma rays the photons of which travel down the glass fiber to be detected by transceiver 1110. Or the reaction produces other particles.

FIG. 12 depicts a schematic view of the photodiode detector 1205. Detector 1205 has electrodes 1230, 1240. Incoming neutrons react with the silicon 28 contained in the substrate of the photodiode.

The previous description of several embodiments describes non-limiting examples that further illustrate the invention. All titles of sections contained in this document, including those appearing above, are not to be construed as limitations on the invention, but rather they are provided to structure the illustrative description of the invention that is provided by the specification.

Unless defined otherwise, all technical and scientific terms used in this document have the same meanings as commonly understood by one skilled in the art to which the disclosed invention pertains. Singular forms—a, an, and the—include plural referents unless the context clearly indicates otherwise. Thus, for example, reference to "fluid" refers to one or more fluids, such as two or more fluids, three or more fluids, etc. When an aspect is said to include a list of components, the list is representative. If the component choice is specifically limited to the list, the disclosure will say so. Moreover, listing components acknowledges that embodiments exist for each of the components and any combination of the components—including combinations that specifically exclude any one or any combination of the listed components. For example, "component A is chosen from A, B, or C" discloses embodiments with A, B, C, AB, AC, BC, and ABC. It also discloses (AB but not C), (AC but not B), and (BC but not A) as embodiments, for example. Combinations that one of ordinary skill in the art knows to be incompatible with each other or with the components' function in the invention are excluded from the invention, in some embodiments.

The terminology used herein is to describe particular example embodiments only and is not intended to be limiting. As used herein, the singular forms "a", "an" and "the" may be intended to include the plural forms as well, unless the context clearly indicates otherwise. The terms "comprises", "comprising", "including", and "having", are inclusive and therefore specify the presence of stated features, integers, steps, operations, elements, and/or components, but do not preclude the presence or addition of one or more other features, integers, steps, operations, elements, components, and/or groups. The method steps, processes, and operations described herein are not to be construed as necessarily requiring their performance in the particular order discussed or illustrated, unless specifically identified as an order of performance. It is also to be understood that additional or alternative steps may be employed, When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on", "directly engaged to", "directly connected to" or "directly coupled to" another element or layer, there may be no intervening elements or layers present. Other words used to describe the relationship between elements should be interpreted in a like fashion (e.g., "between" versus "directly between", "adjacent" versus "directly adjacent", etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer, or section. Terms such as "first", "second", and other numerical terms when used herein do not imply a sequence or order unless clearly indicated by the context. Thus, a first element, component, region, layer, or section discussed below could be termed a second element, component, region, layer, or section without departing from the teachings of the example embodiments.

Spatially relative terms, such as "inner", "outer", "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Moreover, some embodiments recite ranges. When this is done, it is meant to disclose the ranges as a range, and to disclose each and every point within the range, including end points. For those embodiments that disclose a specific value or condition for an aspect, supplementary embodiments exist that are otherwise identical, but that specifically exclude the value or the conditions for the aspect.

The embodiments of the invention described herein are exemplary and numerous modifications, variations and rearrangements can be readily envisioned to achieve substantially equivalent results, all of which are intended to be embraced within the spirit and scope of the invention. Further, the purpose of the foregoing abstract is to enable the U.S. Patent and Trademark Office and the public generally, and especially the scientist, engineers and practitioners in the art who are not familiar with patent or legal terms or phraseology, to determine quickly from a cursory inspection the nature and essence of the technical disclosure of the application.

The following description of several embodiments describes non-limiting examples that further illustrate the invention. No titles of sections contained herein, including those appearing above, are limitations on the invention, but rather they are provided to structure the illustrative description of the invention that is provided by the specification.

Any methods and materials similar or equivalent to those described in this document can be used in the practice or testing of the present invention. This disclosure incorporates by reference all publications mentioned in this disclosure and all of the information disclosed in the publications.

This disclosure discusses publications only to facilitate describing the current invention. Their inclusion in this document is not an admission that they are effective prior art to this invention, nor does it indicate that their dates of publication or effectiveness are as printed on the document.

| | |
|---|---|
| combination | COMB |
| comprises | COMS |
| high-energy | HE |
| ionizing radiation | IR |
| nuclear reaction | NR |
| passivated implanted planar silicon | PIPS |
| photovoltaic | PV |
| receiving axis | RA |
| opening | opng |
| sheets | shs |
| electrodes | elecs |
| material | mat |
| connect | con |
| titanium oxide | Ti ox |
| dopant | dpt |
| sheet | sh |
| implanted | impted |
| cadmium tin oxide | cadt ox |
| cadmium telluride | cadtel |
| copper indium gallium diselenide | CIGdSe |
| tin oxide | Sn ox |
| zinc oxide | Zn ox |
| semiconductor | smcdr |
| blocks | blks |
| volt | VLT |
| neutron | nu |
| neutron | nus |
| wherein | w. |
| thickness | thkns |
| sensor | sen |
| thicknesses | thknses |
| measures | meas. |

Exemplars exmpr1. A nu det. comp. a case with an opng, a RA extending out from the opng, PV shs each comp. elecs, w. the shs stack coaxially along the RA perp to the RA and w. the elecs con to the supporting electronics.

exmpr2. A nu det. comp. a case with an opng, a RA extending out from the opng, PV shs each having a coating and comp. elecs, w. the shs stack coaxially along the RA perp to the RA and w. the elecs con to the supporting electronics.

exmpr3. A nu det. comp. a case with an opng, a RA extending out from the opng, PV shs each having a coating and comp. elecs, w. the shs stack coaxially along the RA perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr4. A nu det. comp. a case with an opng, a RA extending out from the opng, PV shs each having a coating and comp. elecs, w. the shs stack coaxially along the RA perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr5. A nu det. comp. a case with an opng, a RA extending out from the opng, PV shs each having a coating and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr6. A nu det. comp. a case with an opng, a RA extending out from the opng, PV shs each having a dpt ion-impted into at least one sh and comp. elecs, w. the shs stack coaxially along the RA perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr7. A nu det. comp. a case with an opng, a RA extending out from the opng, PV shs each having a dpt ion-impted into at least one sh and comp. elecs, w. the shs stack coaxially along the RA perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr8. A nu det. comp. a case with an opng, a RA extending out from the opng, PV shs each having a dpt ion-impted into at least one sh and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr9. A nu det. comp. a case with an opng, a RA extending out from the opng, a PV sh having a coating and comp. elecs, w. the sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr10. A nu det. comp. a case with an opng, a RA extending out from the opng, a PV sh having a coating and comp. elecs, w. the sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr11. A nu det. comp. a case with an opng, a RA extending out from the opng, a PV sh having a coating and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr12. A nu det. comp. a case with an opng, a RA extending out from the opng, a PV sh with a dpt ion-impted into the sh and comp. elecs, w. the sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr13. A nu det. comp. a case with an opng, a RA extending out from the opng, a PV sh with a dpt ion-impted into the sh and comp. elecs, w. the sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr14. A nu det. comp. a case with an opng, a RA extending out from the opng, a PV sh with a dpt ion-impted into the sh and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr15. A nu det. comp. a case with an opng, a RA extending out from the opng, PV shs at least one sh comp. elecs, w. the at least one sh sits perp to the RA and w. the elecs con to the supporting electronics.

exmpr16. A nu det. comp. a case with an opng, a RA extending out from the opng, PV shs at least one sh comp. elecs and a coating, w. the at least one sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr17. A nu det. comp. a case with an opng, a RA extending out from the opng, PV shs at least one sh comp. elecs and a coating, w. the at least one sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr18. A nu det. comp. a case with an opng, a RA extending out from the opng, PV shs at least one sh comp. elecs and a coating, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr19. A nu det. comp. a case with an opng, a RA extending out from the opng, PV shs having a dpt ion-impted into at least one sh and comp. elecs, w. the at least one sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr20. A nu det. comp. a case with an opng, a RA extending out from the opng, PV shs having a dpt ion-impted into at least one sh and comp. elecs, w. the at least one sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr21. A nu det. comp. a case with an opng, a RA extending out from the opng, PV shs having a dpt ion-impted into at least one sh and comp. elecs, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr22. A nu det. comp. a case with an opng, a RA extending out from the opng, smcdr shs each comp. elecs, w. the shs stack coaxially along the RA perp to the RA and w. the elecs con to the supporting electronics.

exmpr23. A nu det. comp. a case with an opng, a RA extending out from the opng, smcdr shs each having a coating and comp. elecs, w. the shs stack coaxially along the RA perp to the RA and w. the elecs con to the supporting electronics.

exmpr24. A nu det. comp. a case with an opng, a RA extending out from the opng, smcdr shs each having a coating and comp. elecs, w. the shs stack coaxially along the RA perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr25. A nu det. comp. a case with an opng, a RA extending out from the opng, smcdr shs each having a coating and comp. elecs, w. the shs stack coaxially along the RA perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr26. A nu det. comp. a case with an opng, a RA extending out from the opng, smcdr shs each having a coating and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr27. A nu det. comp. a case with an opng, a RA extending out from the opng, smcdr shs each having a dpt ion-impted into at least one sh and comp. elecs, w. the shs stack coaxially along the RA perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr28. A nu det. comp. a case with an opng, a RA extending out from the opng, smcdr shs each having a dpt ion-impted into at least one sh and comp. elecs, w. the shs stack coaxially along the RA perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr29. A nu det. comp. a case with an opng, a RA extending out from the opng, smcdr shs each having a dpt ion-impted into at least one sh and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr30. A nu det. comp. a case with an opng, a RA extending out from the opng, a smcdr sh having a coating and comp. elecs, w. the sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr31. A nu det. comp. a case with an opng, a RA extending out from the opng, a smcdr sh having a coating and comp. elecs, w. the sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr32. A nu det. comp. a case with an opng, a RA extending out from the opng, a smcdr sh having a coating and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr33. A nu det. comp. a case with an opng, a RA extending out from the opng, a smcdr sh with a dpt ion-impted into the sh and comp. elecs, w. the sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr34. A nu det. comp. a case with an opng, a RA extending out from the opng, a smcdr sh with a dpt ion-impted into the sh and comp. elecs, w. the sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr35. A nu det. comp. a case with an opng, a RA extending out from the opng, a smcdr sh with a dpt ion-impted into the sh and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr36. A nu det. comp. a case with an opng, a RA extending out from the opng, smcdr shs at least one sh comp. elecs, w. the at least one sh sits perp to the RA and w. the elecs con to the supporting electronics.

exmpr37. A nu det. comp. a case with an opng, a RA extending out from the opng, smcdr shs at least one sh comp. elecs and a coating, w. the at least one sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr38. A nu det. comp. a case with an opng, a RA extending out from the opng, smcdr shs at least one sh comp. elecs and a coating, w. the at least one sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr39. A nu det. comp. a case with an opng, a RA extending out from the opng, smcdr shs at least one sh comp. elecs and a coating, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr40. A nu det. comp. a case with an opng, a RA extending out from the opng, smcdr shs having a dpt ion-impted into at least one sh and comp. elecs, w. the at least one sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr41. A nu det. comp. a case with an opng, a RA extending out from the opng, smcdr shs having a dpt ion-impted into at least one sh and comp. elecs, w. the at least one sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr42. A nu det. comp. a case with an opng, a RA extending out from the opng, smcdr shs having a dpt ion-impted into at least one sh and comp. elecs, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr43. A nu det. comp. a case with an opng, a RA extending out from the opng, PV shs each comp. elecs, w. the shs stack along the RA and w. the elecs con to the supporting electronics.

exmpr44. A nu det. comp. a case with an opng, a RA extending out from the opng, smcdr shs each comp. elecs, w. the shs stack coaxially along the RA and w. the elecs con to the supporting electronics.

exmpr45. A nu det. comp. a case with an opng, a RA extending out from the opng, PV shs each comp. elecs, w. the shs stack along the RA.

exmpr46. A nu det. comp. a case with an opng, a RA extending out from the opng, smcdr shs each comp. elecs, w. the shs stack coaxially along the RA.

exmpr47. A nu det. comp. a case with an opng, a RA extending out from the opng, PV blks disposed in the case each comp. elecs, w. the blks stack coaxially along the RA perp to the RA and w. the elecs con to the supporting electronics.

exmpr48. A nu det. comp. a case with an opng, a RA extending out from the opng, PV blks disposed in the case each having a coating and comp. elecs, w. the blks stack coaxially along the RA perp to the RA and w. the elecs con to the supporting electronics.

exmpr49. A nu det. comp. a case with an opng, a RA extending out from the opng, PV blks disposed in the case each having a coating and comp. elecs, w. the blks stack coaxially along the RA perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, and the elecs con to the supporting electronics.

exmpr50. A nu det. comp. a case with an opng, a RA extending out from the opng, PV blks disposed in the case each having a coating and comp. elecs, w. the blks stack coaxially along the RA perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr51. A nu det. comp. a case with an opng, a RA extending out from the opng, PV blks disposed in the case each having a coating and comp. elecs, w. the blks stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr52. A nu det. comp. a case with an opng, a RA extending out from the opng, PV blks disposed in the case each having a dpt ion-impted into at least one blk and comp. elecs, w. the blks stack coaxially along the RA perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, and the elecs con to the supporting electronics.

exmpr53. A nu det. comp. a case with an opng, a RA extending out from the opng, PV blks disposed in the case each having a dpt ion-impted into at least one blk and comp. elecs, w. the blks stack coaxially along the RA perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr54. A nu det. comp. a case with an opng, a RA extending out from the opng, PV blks disposed in the case each having a dpt ion-impted into at least one blk and comp. elecs, w. the blks stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr55. A nu det. comp. a case with an opng, a RA extending out from the opng, a PV blk having a coating and comp. elecs, w. the blk sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, and the elecs con to the supporting electronics.

exmpr56. A nu det. comp. a case with an opng, a RA extending out from the opng, a PV blk having a coating and comp. elecs, w. the blk sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr57. A nu det. comp. a case with an opng, a RA extending out from the opng, a PV blk having a coating and comp. elecs, w. the blk sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr58. A nu det. comp. a case with an opng, a RA extending out from the opng, a PV blk with a dpt ion-impted into the blk and comp. elecs, w. the blk sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, and the elecs con to the supporting electronics.

exmpr59. A nu det. comp. a case with an opng, a RA extending out from the opng, a PV blk with a dpt ion-impted into the blk and comp. elecs, w. the blk sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr60. A nu det. comp. a case with an opng, a RA extending out from the opng, a PV blk with a dpt ion-impted into the blk and comp. elecs, w. the blk sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr61. A nu det. comp. a case with an opng, a RA extending out from the opng, PV blks at least one blk comp. elecs, w. the at least one blk sits perp to the RA and w. the elecs con to the supporting electronics.

exmpr62. A nu det. comp. a case with an opng, a RA extending out from the opng, PV blks at least one blk comp. elecs and a coating, w. the at least one blk sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr63. A nu det. comp. a case with an opng, a RA extending out from the opng, PV blks at least one blk comp. elecs and a coating, w. the at least one blk sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr64. A nu det. comp. a case with an opng, a RA extending out from the opng, PV blks at least one blk comp. elecs and a coating, w. the at least one blk sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr65. A nu det. comp. a case with an opng, a RA extending out from the opng, PV blks having a dpt ion-impted into at least one blk and comp. elecs, w. the at least one blk sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr66. A nu det. comp. a case with an opng, a RA extending out from the opng, PV blks having a dpt ion-impted into at least one blk and comp. elecs, w. the at least one blk sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr67. A nu det. comp. a case with an opng, a RA extending out from the opng, PV blks having a dpt ion-impted into at least one blk and comp. elecs, w. the at least one blk sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr68. A nu det. comp. a case with an opng, a RA extending out from the opng, smcdr blks disposed in the case each comp. elecs, w. the blks stack coaxially along the RA perp to the RA and w. the elecs con to the supporting electronics.

exmpr69. A nu det. comp. a case with an opng, a RA extending out from the opng, smcdr blks disposed in the case each having a coating and comp. elecs, w. the blks stack coaxially along the RA perp to the RA and w. the elecs con to the supporting electronics.

exmpr70. A nu det. comp. a case with an opng, a RA extending out from the opng, smcdr blks disposed in the case each having a coating and comp. elecs, w. the blks stack coaxially along the RA perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr71. A nu det. comp. a case with an opng, a RA extending out from the opng, smcdr blks disposed in the case each having a coating and comp. elecs, w. the blks stack coaxially along the RA perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr72. A nu det. comp. a case with an opng, a RA extending out from the opng, smcdr blks disposed in the case each having a coating and comp. elecs, w. the blks stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr73. A nu det. comp. a case with an opng, a RA extending out from the opng, smcdr blks disposed in the case each having a dpt ion-impted into at least one blk and comp. elecs, w. the blks stack coaxially along the RA perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr74. A nu det. comp. a case with an opng, a RA extending out from the opng, smcdr blks disposed in the case each having a dpt ion-impted into at least one blk and comp. elecs, w. the blks stack coaxially along the RA perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr75. A nu det. comp. a case with an opng, a RA extending out from the opng, smcdr blks disposed in the case each having a dpt ion-impted into at least one blk and comp. elecs, w. the blks stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr76. A nu det. comp. a case with an opng, a RA extending out from the opng, a smcdr blk having a coating and comp. elecs, w. the blk sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr77. A nu det. comp. a case with an opng, a RA extending out from the opng, a smcdr blk having a coating and comp. elecs, w. the blk sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr78. A nu det. comp. a case with an opng, a RA extending out from the opng, a smcdr blk having a coating and comp. elecs, w. the blk sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr79. A nu det. comp. a case with an opng, a RA extending out from the opng, a smcdr blk with a dpt ion-impted into the blk and comp. elecs, w. the blk sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr80. A nu det. comp. a case with an opng, a RA extending out from the opng, a smcdr blk with a dpt ion-impted into the blk and comp. elecs, w. the blk sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr81. A nu det. comp. a case with an opng, a RA extending out from the opng, a smcdr blk with a dpt ion-impted into the blk and comp. elecs, w. the blk sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr82. A nu det. comp. a case with an opng, a RA extending out from the opng, smcdr blks at least one blk comp. elecs, w. the at least one blk sits perp to the RA and w. the elecs con to the supporting electronics.

exmpr83. A nu det. comp. a case with an opng, a RA extending out from the opng, smcdr blks at least one blk comp. elecs and a coating, w. the at least one blk sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, and the elecs con to the supporting electronics.

exmpr84. A nu det. comp. a case with an opng, a RA extending out from the opng, smcdr blks at least one blk comp. elecs and a coating, w. the at least one blk sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr85. A nu det. comp. a case with an opng, a RA extending out from the opng, smcdr blks at least one blk comp. elecs and a coating, w. the at least one blk sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr86. A nu det. comp. a case with an opng, a RA extending out from the opng, smcdr blks having a dpt ion-impted into at least one blk and comp. elecs, w. the at least one blk sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, and the elecs con to the supporting electronics.

exmpr87. A nu det. comp. a case with an opng, a RA extending out from the opng, smcdr blks having a dpt ion-impted into at least one blk and comp. elecs, w. the at least one blk sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr88. A nu det. comp. a case with an opng, a RA extending out from the opng, smcdr blks having a dpt ion-impted into at least one blk and comp. elecs, w. the at least one blk sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr89. A nu det. comp. a case with an opng, a RA extending out from the opng, PV blks disposed in the case each comp. elecs, w. the blks stack along the RA and w. the elecs con to the supporting electronics.

exmpr90. A nu det. comp. a case with an opng, a RA extending out from the opng, smcdr blks disposed in the case each comp. elecs, w. the blks stack coaxially along the RA and w. the elecs con to the supporting electronics.

exmpr91. A nu det. comp. a case with an opng, a RA extending out from the opng, PV blks disposed in the case each comp. elecs, w. the blks stack along the RA.

exmpr92. A nu det. comp. a case with an opng, a RA extending out from the opng, smcdr blks disposed in the case each comp. elecs, w. the blks stack coaxially along the RA.

exmpr93. A nu det. comp. a case with an opng, PV blks disposed in the case each comp. elecs, w. the elecs con to the supporting electronics.

exmpr94. A nu det. comp. a case with an opng, PV blks disposed in the case each having a coating and comp. elecs, w. the elecs con to the supporting electronics.

exmpr95. A nu det. comp. a case with an opng, PV blks disposed in the case each having a coating and comp. elecs, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, and the elecs con to the supporting electronics.

exmpr96. A nu det. comp. a case with an opng, PV blks disposed in the case each having a coating and comp. elecs, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr97. A nu det. comp. a case with an opng, PV blks disposed in the case each having a coating and comp. elecs, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr98. A nu det. comp. a case with an opng, PV blks disposed in the case each having a dpt ion-impted into at least one blk and comp. elecs, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, and the elecs con to the supporting electronics.

exmpr99. A nu det. comp. a case with an opng, PV blks disposed in the case each having a dpt ion-impted into at least one blk and comp. elecs, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr100. A nu det. comp. a case with an opng, PV blks disposed in the case each having a dpt ion-impted into at least one blk and comp. elecs, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr101. A nu det. comp. a case with an opng, a PV blk having a coating and comp. elecs, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, and the elecs con to the supporting electronics.

exmpr102. A nu det. comp. a case with an opng, a PV blk having a coating and comp. elecs, w. the coating COMS a mat. selected from any one or any COMB of the following:

Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr103. A nu det. comp. a case with an opng, a PV blk having a coating and comp. elecs, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr104. A nu det. comp. a case with an opng, a PV blk with a dpt ion-impted into the blk and comp. elecs, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr105. A nu det. comp. a case with an opng, a PV blk with a dpt ion-impted into the blk and comp. elecs, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr106. A nu det. comp. a case with an opng, a PV blk with a dpt ion-impted into the blk and comp. elecs, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr107. A nu det. comp. a case with an opng, PV blks at least one blk comp. elecs, w. the elecs con to the supporting electronics.

exmpr108. A nu det. comp. a case with an opng, PV blks at least one blk comp. elecs and a coating w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr109. A nu det. comp. a case with an opng, PV blks at least one blk comp. elecs and a coating w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr110. A nu det. comp. a case with an opng, PV blks at least one blk comp. elecs and a coating w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr111. A nu det. comp. a case with an opng, PV blks having a dpt ion-impted into at least one blk and comp. elecs w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr112. A nu det. comp. a case with an opng, PV blks having a dpt ion-impted into at least one blk and comp. elecs w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr113. A nu det. comp. a case with an opng, PV blks having a dpt ion-impted into at least one blk and comp. elecs w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr114. A nu det. comp. a case with an opng, smcdr blks disposed in the case each comp. elecs, w. the elecs con to the supporting electronics.

exmpr115. A nu det. comp. a case with an opng, smcdr blks disposed in the case each having a coating and comp. elecs, w. the elecs con to the supporting electronics.

exmpr116. A nu det. comp. a case with an opng, smcdr blks disposed in the case each having a coating and comp. elecs, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr117. A nu det. comp. a case with an opng, smcdr blks disposed in the case each having a coating and comp. elecs, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr118. A nu det. comp. a case with an opng, smcdr blks disposed in the case each having a coating and comp. elecs, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr119. A nu det. comp. a case with an opng, smcdr blks disposed in the case each having a dpt ion-impted into at least one blk and comp. elecs, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr120. A nu det. comp. a case with an opng, smcdr blks disposed in the case each having a dpt ion-impted into at least one blk and comp. elecs, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr121. A nu det. comp. a case with an opng, smcdr blks disposed in the case each having a dpt ion-impted into at least one blk and comp. elecs, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr122. A nu det. comp. a case with an opng, a smcdr blk having a coating and comp. elecs, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr123. A nu det. comp. a case with an opng, a smcdr blk having a coating and comp. elecs, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr124. A nu det. comp. a case with an opng, a smcdr blk having a coating and comp. elecs, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr125. A nu det. comp. a case with an opng, a smcdr blk with a dpt ion-impted into the blk and comp. elecs, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr126. A nu det. comp. a case with an opng, a smcdr blk with a dpt ion-impted into the blk and comp. elecs, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr127. A nu det. comp. a case with an opng, a smcdr blk with a dpt ion-impted into the blk and comp. elecs, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr128. A nu det. comp. a case with an opng, smcdr blks at least one blk comp. elecs, w. the elecs con to the supporting electronics.

exmpr129. A nu det. comp. a case with an opng, smcdr blks at least one blk comp. elecs and a coating w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr130. A nu det. comp. a case with an opng, smcdr blks at least one blk comp. elecs and a coating w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr131. A nu det. comp. a case with an opng, smcdr blks at least one blk comp. elecs and a coating w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr132. A nu det. comp. a case with an opng, smcdr blks having a dpt ion-impted into at least one blk and comp. elecs w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr133. A nu det. comp. a case with an opng, smcdr blks having a dpt ion-impted into at least one blk and comp. elecs w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr134. A nu det. comp. a case with an opng, smcdr blks having a dpt ion-impted into at least one blk and comp. elecs w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr135. A nu det. comp. a case with an opng, PV blks disposed in the case each comp. elecs, w. the blks stack along the RA and w. the elecs con to the supporting electronics.

exmpr136. A nu det. comp. a case with an opng, smcdr blks disposed in the case each comp. elecs, w. the blks stack coaxially along the RA and w. the elecs con to the supporting electronics.

exmpr137. A nu det. comp. a case with an opng, PV blks disposed in the case each comp. elecs, w. the blks stack along the RA.

exmpr138. A nu det. comp. a case with an opng, smcdr blks disposed in the case each comp. elecs, w. the blks stack coaxially along the RA.

exmpr139. A nu det. comp. a case with an opng, smcdr blks disposed in the case each comp. elecs, w. the blks stack along the RA and w. the elecs con to the supporting electronics.

exmpr140. A nu det. comp. a case with an opng, smcdr blks disposed in the case each comp. elecs, w. the blks stack along the RA.

exmpr141. A nu det. comp. a case with an opng, PV shs each comp. elecs, w. the shs stack and w. the elecs con to the supporting electronics.

exmpr142. A nu det. comp. a case with an opng, PV shs each having a coating and comp. elecs, w. the shs stack and w. the elecs con to the supporting electronics.

exmpr143. A nu det. comp. a case with an opng, PV shs each having a coating and comp. elecs, w. the shs stack, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr144. A nu det. comp. a case with an opng, PV shs each having a coating and comp. elecs, w. the shs stack, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr145. A nu det. comp. a case with an opng, PV shs each having a coating and comp. elecs, w. the shs stack, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr146. A nu det. comp. a case with an opng, PV shs each having a dpt ion-impted into at least one sh and comp. elecs, w. the shs stack, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr147. A nu det. comp. a case with an opng, PV shs each having a dpt ion-impted into at least one sh and comp. elecs, w. the shs stack, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr148. A nu det. comp. a case with an opng, PV shs each having a dpt ion-impted into at least one sh and comp. elecs, w. the shs stack, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr149. A nu det. comp. a case with an opng, a PV sh having a coating and comp. elecs, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr150. A nu det. comp. a case with an opng, a PV sh having a coating and comp. elecs, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr151. A nu det. comp. a case with an opng, a PV sh having a coating and comp. elecs. w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr152. A nu det. comp. a case with an opng, a PV sh with a dpt ion-impted into the sh and comp. elecs. w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr153. A nu det. comp. a case with an opng, a PV sh with a dpt ion-impted into the sh and comp. elecs. w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr154. A nu det. comp. a case with an opng, a PV sh with a dpt ion-impted into the sh and comp. elecs. w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr155. A nu det. comp. a case with an opng, PV shs at least one sh comp. elecs, and w. the elecs con to the supporting electronics.

exmpr156. A nu det. comp. a case with an opng, PV shs at least one sh comp. elecs and a coating, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr157. A nu det. comp. a case with an opng, PV shs at least one sh comp. elecs and a coating, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr158. A nu det. comp. a case with an opng, PV shs at least one sh comp. elecs and a coating, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr159. A nu det. comp. a case with an opng, PV shs having a dpt ion-impted into at least one sh and comp. elecs, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr160. A nu det. comp. a case with an opng, PV shs having a dpt ion-impted into at least one sh and comp. elecs, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr161. A nu det. comp. a case with an opng, PV shs having a dpt ion-impted into at least one sh and comp. elecs, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr162. A nu det. comp. a case with an opng, smcdr shs each comp. elecs, w. the shs stack and w. the elecs con to the supporting electronics.

exmpr163. A nu det. comp. a case with an opng, smcdr shs each having a coating and comp. elecs, w. the shs stack and w. the elecs con to the supporting electronics.

exmpr164. A nu det. comp. a case with an opng, smcdr shs each having a coating and comp. elecs, w. the shs stack, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr165. A nu det. comp. a case with an opng, smcdr shs each having a coating and comp. elecs, w. the shs stack, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr166. A nu det. comp. a case with an opng, smcdr shs each having a coating and comp. elecs, w. the shs stack, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr167. A nu det. comp. a case with an opng, smcdr shs each having a dpt ion-impted into at least one sh and comp. elecs, w. the shs stack, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr168. A nu det. comp. a case with an opng, smcdr shs each having a dpt ion-impted into at least one sh and comp. elecs, w. the shs stack, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr169. A nu det. comp. a case with an opng, smcdr shs each having a dpt ion-impted into at least one sh and comp. elecs, w. the shs stack, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr170. A nu det. comp. a case with an opng, a smcdr sh having a coating and comp. elecs, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr171. A nu det. comp. a case with an opng, a smcdr sh having a coating and comp. elecs, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr172. A nu det. comp. a case with an opng, a smcdr sh having a coating and comp. elecs, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr173. A nu det. comp. a case with an opng, a smcdr sh with a dpt ion-impted into the sh and comp. elecs, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr174. A nu det. comp. a case with an opng, a smcdr sh with a dpt ion-impted into the sh and comp. elecs, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr175. A nu det. comp. a case with an opng, a smcdr sh with a dpt ion-impted into the sh and comp. elecs, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr176. A nu det. comp. a case with an opng, smcdr shs at least one sh comp. elecs, and w. the elecs con to the supporting electronics.

exmpr177. A nu det. comp. a case with an opng, smcdr shs at least one sh comp. elecs and a coating, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr178. A nu det. comp. a case with an opng, smcdr shs at least one sh comp. elecs and a coating, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr179. A nu det. comp. a case with an opng, smcdr shs at least one sh comp. elecs and a coating, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr180. A nu det. comp. a case with an opng, smcdr shs having a dpt ion-impted into at least one sh and comp. elecs, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr181. A nu det. comp. a case with an opng, smcdr shs having a dpt ion-impted into at least one sh and comp. elecs, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr182. A nu det. comp. a case with an opng, smcdr shs having a dpt ion-impted into at least one sh and comp. elecs, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr183. A nu det. comp. a case with an opng, PV shs each comp. elecs w. the elecs con to the supporting electronics.

exmpr184. A nu det. comp. a case with an opng, smcdr shs each comp.

elecs and w. the elecs con to the supporting electronics.

exmpr185. A nu det. comp. a case with an opng, PV shs each comp. elecs.

exmpr186. A nu det. comp. a case with an opng, smcdr shs each comp. elecs.

exmpr187. A nu det. comp. a case with an opng, PV blks disposed in the case each comp. elecs, w. the blks stack and w. the elecs con to the supporting electronics.

exmpr188. A nu det. comp. a case with an opng, PV blks disposed in the case each having a coating and comp. elecs, w. the blks stack and w. the elecs con to the supporting electronics.

exmpr189. A nu det. comp. a case with an opng, PV blks disposed in the case each having a coating and comp. elecs, w. the blks stack, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr190. A nu det. comp. a case with an opng, PV blks disposed in the case each having a coating and comp. elecs, w. the blks stack, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr191. A nu det. comp. a case with an opng, PV blks disposed in the case each having a coating and comp. elecs, w. the blks stack, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr192. A nu det. comp. a case with an opng, PV blks disposed in the case each having a dpt ion-impted into at least one blk and comp. elecs, w. the blks stack, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr193. A nu det. comp. a case with an opng, PV blks disposed in the case each having a dpt ion-impted into at least one blk and comp. elecs, w. the blks stack, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr194. A nu det. comp. a case with an opng, PV blks disposed in the case each having a dpt ion-impted into at least one blk and comp. elecs, w. the blks stack, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr195. A nu det. comp. a case with an opng, PV blks at least one blk comp. elecs w. the elecs con to the supporting electronics.

exmpr196. A nu det. comp. a case with an opng, PV blks at least one blk comp. elecs and a coating, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr197. A nu det. comp. a case with an opng, PV blks at least one blk comp. elecs and a coating, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr198. A nu det. comp. a case with an opng, PV blks at least one blk comp. elecs and a coating, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr199. A nu det. comp. a case with an opng, PV blks having a dpt ion-impted into at least one blk and comp.

elecs, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, and the elecs con to the supporting electronics.

exmpr200. A nu det. comp. a case with an opng, PV blks having a dpt ion-impted into at least one blk and comp. elecs, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr201. A nu det. comp. a case with an opng, PV blks having a dpt ion-impted into at least one blk and comp. elecs, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr202. A nu det. comp. a case with an opng, smcdr blks disposed in the case each comp. elecs, w. the blks stack and w. the elecs con to the supporting electronics.

exmpr203. A nu det. comp. a case with an opng, smcdr blks disposed in the case each having a coating and comp. elecs, w. the blks stack and w. the elecs con to the supporting electronics.

exmpr204. A nu det. comp. a case with an opng, smcdr blks disposed in the case each having a coating and comp. elecs, w. the blks stack, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, and the elecs con to the supporting electronics.

exmpr205. A nu det. comp. a case with an opng, smcdr blks disposed in the case each having a coating and comp. elecs, w. the blks stack, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr206. A nu det. comp. a case with an opng, smcdr blks disposed in the case each having a coating and comp. elecs, w. the blks stack, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr207. A nu det. comp. a case with an opng, smcdr blks disposed in the case each having a dpt ion-impted into at least one blk and comp. elecs, w. the blks stack, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, and the elecs con to the supporting electronics.

exmpr208. A nu det. comp. a case with an opng, smcdr blks disposed in the case each having a dpt ion-impted into at least one blk and comp. elecs, w. the blks stack, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr209. A nu det. comp. a case with an opng, smcdr blks disposed in the case each having a dpt ion-impted into at least one blk and comp. elecs, w. the blks stack, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr210. A nu det. comp. a case with an opng, smcdr blks at least one blk comp. elecs w. the elecs con to the supporting electronics.

exmpr211. A nu det. comp. a case with an opng, smcdr blks at least one blk comp. elecs and a coating, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, and the elecs con to the supporting electronics.

exmpr212. A nu det. comp. a case with an opng, smcdr blks at least one blk comp. elecs and a coating, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr213. A nu det. comp. a case with an opng, smcdr blks at least one blk comp. elecs and a coating, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr214. A nu det. comp. a case with an opng, smcdr blks having a dpt ion-impted into at least one blk and comp. elecs, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, and the elecs con to the supporting electronics.

exmpr215. A nu det. comp. a case with an opng, smcdr blks having a dpt ion-impted into at least one blk and comp. elecs, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr216. A nu det. comp. a case with an opng, smcdr blks having a dpt ion-impted into at least one blk and comp. elecs, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr217. A nu det. comp. a case with an opng, PV blks disposed in the case each comp. elecs.

exmpr218. A nu det. comp. a case with an opng, smcdr blks disposed in the case each comp. elecs.

exmpr219. A nu det. comp. a case with an opng, a RA extending out from the opng, PV shs each comp. elecs, w. the shs stack coaxially along the RA perp to the RA and w. the elecs con to the supporting electronics.

exmpr220. A nu det. comp. a case with an opng, a RA extending out from the opng, PV shs each having a coating and comp. elecs, w. the shs stack coaxially along the RA perp to the RA and w. the elecs con to the supporting electronics.

exmpr221. A nu det. comp. a case with an opng, a RA extending out from the opng, PV shs each having a coating and comp. elecs, w. the shs stack coaxially along the RA perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, and the elecs con to the supporting electronics.

exmpr222. A nu det. comp. a case with an opng, a RA extending out from the opng, PV shs each having a coating and comp. elecs, w. the shs stack coaxially along the RA perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics. A nu det. comp. a case with an opng, a RA extending out from the opng, PV shs each having a coating and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr223. A nu det. comp. a case with an opng, a RA extending out from the opng, PV shs each having a dpt ion-impted into at least one sh and comp. elecs, w. the shs stack coaxially along the RA perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr224. A nu det. comp. a case with an opng, a RA extending out from the opng, PV shs each having a dpt ion-impted into at least one sh and comp. elecs, w. the shs stack coaxially along the RA perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr225. A nu det. comp. a case with an opng, a RA extending out from the opng, PV shs each having a dpt ion-impted into at least one sh and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr226. A nu det. comp. a case with an opng, a RA extending out from the opng, a PV sh having a coating and comp. elecs, w. the sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr227. A nu det. comp. a case with an opng, a RA extending out from the opng, a PV sh having a coating and comp. elecs, w. the sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr228. A nu det. comp. a case with an opng, a RA extending out from the opng, a PV sh having a coating and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr229. A nu det. comp. a case with an opng, a RA extending out from the opng, a PV sh with a dpt ion-impted into the sh and comp. elecs, w. the sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr230. A nu det. comp. a case with an opng, a RA extending out from the opng, a PV sh with a dpt ion-impted into the sh and comp. elecs, w. the sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr231. A nu det. comp. a case with an opng, a RA extending out from the opng, a PV sh with a dpt ion-impted into the sh and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr232. A nu det. comp. a case with an opng, a RA extending out from the opng, PV shs at least one sh comp. elecs, w. the at least one sh sits perp to the RA and w. the elecs con to the supporting electronics.

exmpr233. A nu det. comp. a case with an opng, a RA extending out from the opng, PV shs at least one sh comp. elecs and a coating, w. the at least one sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr234. A nu det. comp. a case with an opng, a RA extending out from the opng, PV shs at least one sh comp. elecs and a coating, w. the at least one sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr235. A nu det. comp. a case with an opng, a RA extending out from the opng, PV shs at least one sh comp. elecs and a coating, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr236. A nu det. comp. a case with an opng, a RA extending out from the opng, PV shs having a dpt ion-impted into at least one sh and comp. elecs, w. the at least one sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr237. A nu det. comp. a case with an opng, a RA extending out from the opng, PV shs having a dpt ion-impted into at least one sh and comp. elecs, w. the at least one sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr238. A nu det. comp. a case with an opng, a RA extending out from the opng, PV shs having a dpt ion-impted into at least one sh and comp. elecs, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr239. A nu det. comp. a case with an opng, a RA extending out from the opng, smcdr shs each comp. elecs, w. the shs stack coaxially along the RA perp to the RA and w. the elecs con to the supporting electronics.

exmpr240. A nu det. comp. a case with an opng, a RA extending out from the opng, smcdr shs each having a coating and comp. elecs, w. the shs stack coaxially along the RA perp to the RA and w. the elecs con to the supporting electronics.

exmpr241. A nu det. comp. a case with an opng, a RA extending out from the opng, smcdr shs each having a coating and comp. elecs, w. the shs stack coaxially along the RA perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr242. A nu det. comp. a case with an opng, a RA extending out from the opng, smcdr shs each having a coating and comp. elecs, w. the shs stack coaxially along the RA perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr243. A nu det. comp. a case with an opng, a RA extending out from the opng, smcdr shs each having a coating and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr244. A nu det. comp. a case with an opng, a RA extending out from the opng, smcdr shs each having a dpt ion-impted into at least one sh and comp. elecs, w. the shs stack coaxially along the RA perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr245. A nu det. comp. a case with an opng, a RA extending out from the opng, smcdr shs each having a dpt ion-impted into at least one sh and comp. elecs, w. the shs stack coaxially along the RA perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr246. A nu det. comp. a case with an opng, a RA extending out from the opng, smcdr shs each having a dpt ion-impted into at least one sh and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr247. A nu det. comp. a case with an opng, a RA extending out from the opng, a smcdr sh having a coating and comp. elecs, w. the sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr248. A nu det. comp. a case with an opng, a RA extending out from the opng, a smcdr sh having a coating and comp. elecs, w. the sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr249. A nu det. comp. a case with an opng, a RA extending out from the opng, a smcdr sh having a coating and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr250. A nu det. comp. a case with an opng, a RA extending out from the opng, a smcdr sh with a dpt ion-impted into the sh and comp. elecs, w. the sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr251. A nu det. comp. a case with an opng, a RA extending out from the opng, a smcdr sh with a dpt ion-impted into the sh and comp. elecs, w. the sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr252. A nu det. comp. a case with an opng, a RA extending out from the opng, a smcdr sh with a dpt ion-impted into the sh and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr253. A nu det. comp. a case with an opng, a RA extending out from the opng, smcdr shs at least one sh comp. elecs, w. the at least one sh sits perp to the RA and w. the elecs con to the supporting electronics.

exmpr254. A nu det. comp. a case with an opng, a RA extending out from the opng, smcdr shs at least one sh comp. elecs and a coating, w. the at least one sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr255. A nu det. comp. a case with an opng, a RA extending out from the opng, smcdr shs at least one sh comp. elecs and a coating, w. the at least one sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr256. A nu det. comp. a case with an opng, a RA extending out from the opng, smcdr shs at least one sh comp. elecs and a coating, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, and the elecs con to the supporting electronics.

exmpr257. A nu det. comp. a case with an opng, a RA extending out from the opng, smcdr shs having a dpt ion-impted into at least one sh and comp. elecs, w. the at least one sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, and the elecs con to the supporting electronics.

exmpr258. A nu det. comp. a case with an opng, a RA extending out from the opng, smcdr shs having a dpt ion-impted into at least one sh and comp. elecs, w. the at least one sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, and the elecs con to the supporting electronics.

exmpr259. A nu det. comp. a case with an opng, a RA extending out from the opng, smcdr shs having a dpt ion-impted into at least one sh and comp. elecs, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, and the elecs con to the supporting electronics.

exmpr260. A nu det. comp. a case with an opng, a RA extending out from the opng, PV shs each having a coating and comp. elecs, w. the shs stack coaxially along the RA perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr261. A nu det. comp. a case with an opng, a RA extending out from the opng, PV shs each having a coating and comp. elecs, w. the shs stack coaxially along the RA perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr262. A nu det. comp. a case with an opng, a RA extending out from the opng, PV shs each having a coating and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, and w. the det. is adapted to provide a det. resolution of less than or equal to 125, 120, 115, 110, 105, 100, 95, 90, 85, 80, or 75 KeV.

exmpr263. A nu det. comp. a case with an opng, a RA extending out from the opng, PV shs each having a dpt ion-impted into at least one sh and comp. elecs, w. the shs stack coaxially along the RA perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr264. A nu det. comp. a case with an opng, a RA extending out from the opng, PV shs each having a dpt ion-impted into at least one sh and comp. elecs, w. the shs stack coaxially along the RA perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr265. A nu det. comp. a case with an opng, a RA extending out from the opng, PV shs each having a dpt ion-impted into at least one sh and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, and w. the det. is adapted to provide a det. resolution of less than or equal to 125, 120, 115, 110, 105, 100, 95, 90, 85, 80, or 75 KeV.

exmpr266. A nu det. comp. a case with an opng, a RA extending out from the opng, a PV sh having a coating and comp. elecs, w. the sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr267. A nu det. comp. a case with an opng, a RA extending out from the opng, a PV sh having a coating and comp. elecs, w. the sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr268. A nu det. comp. a case with an opng, a RA extending out from the opng, a PV sh having a coating and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, and w. the det. is adapted to provide a det. resolution of less than or equal to 125, 120, 115, 110, 105, 100, 95, 90, 85, 80, or 75 KeV.

exmpr269. A nu det. comp. a case with an opng, a RA extending out from the opng, a PV sh with a dpt ion-impted into the sh and comp. elecs, w. the sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr270. A nu det. comp. a case with an opng, a RA extending out from the opng, a PV sh with a dpt ion-impted into the sh and comp. elecs, w. the sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr271. A nu det. comp. a case with an opng, a RA extending out from the opng, a PV sh with a dpt ion-impted into the sh and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, and w. the det. is adapted to provide a det. resolution of less than or equal to 125, 120, 115, 110, 105, 100, 95, 90, 85, 80, or 75 KeV.

exmpr272. A nu det. comp. a case with an opng, a RA extending out from the opng, PV shs at least one sh comp. elecs, w. the at least one sh sits perp to the RA w. the elecs con to the supporting electronics, and w. the det. is adapted to provide a det. resolution of less than or equal to 125, 120, 115, 110, 105, 100, 95, 90, 85, 80, or 75 KeV.

exmpr273. A nu det. comp. a case with an opng, a RA extending out from the opng, PV shs at least one sh comp. elecs and a coating, w. the at least one sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr274. A nu det. comp. a case with an opng, a RA extending out from the opng, PV shs at least one sh comp. elecs and a coating, w. the at least one sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr275. A nu det. comp. a case with an opng, a RA extending out from the opng, PV shs at least one sh comp. elecs and a coating, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, and w. the det. is adapted to provide a det. resolution of less than or equal to 125, 120, 115, 110, 105, 100, 95, 90, 85, 80, or 75 KeV.

exmpr276. A nu det. comp. a case with an opng, a RA extending out from the opng, PV shs having a dpt ion-impted into at least one sh and comp. elecs, w. the at least one sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr277. A nu det. comp. a case with an opng, a RA extending out from the opng, PV shs having a dpt ion-impted into at least one sh and comp. elecs, w. the at least one sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr278. A nu det. comp. a case with an opng, a RA extending out from the opng, PV shs having a dpt ion-impted into at least one sh and comp. elecs, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, and w. the det. is adapted to provide a det. resolution of less than or equal to 125, 120, 115, 110, 105, 100, 95, 90, 85, 80, or 75 KeV.

exmpr279. A nu det. comp. a case with an opng, a RA extending out from the opng, smcdr shs each comp. elecs, w. the shs stack coaxially along the RA perp to the RA w. the elecs con to the supporting electronics, and w. the det. is adapted to provide a det. resolution of less than or equal to 125, 120, 115, 110, 105, 100, 95, 90, 85, 80, or 75 KeV.

exmpr280. A nu det. comp. a case with an opng, a RA extending out from the opng, smcdr shs each having a coating and comp. elecs, w. the shs stack coaxially along the RA perp to the RA w. the elecs con to the supporting electronics, and w. the det. is adapted to provide a det. resolution of less than or equal to 125, 120, 115, 110, 105, 100, 95, 90, 85, 80, or 75 KeV.

exmpr281. A nu det. comp. a case with an opng, a RA extending out from the opng, smcdr shs each having a coating and comp. elecs, w. the shs stack coaxially along the RA perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr282. A nu det. comp. a case with an opng, a RA extending out from the opng, smcdr shs each having a coating and comp. elecs, w. the shs stack coaxially along the RA perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr283. A nu det. comp. a case with an opng, a RA extending out from the opng, smcdr shs each having a coating and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, and w. the det. is adapted to provide a det. resolution of less than or equal to 125, 120, 115, 110, 105, 100, 95, 90, 85, 80, or 75 KeV.

exmpr284. A nu det. comp. a case with an opng, a RA extending out from the opng, smcdr shs each having a dpt ion-impted into at least one sh and comp. elecs, w. the shs stack coaxially along the RA perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr285. A nu det. comp. a case with an opng, a RA extending out from the opng, smcdr shs each having a dpt ion-impted into at least one sh and comp. elecs, w. the shs stack coaxially along the RA perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr286. A nu det. comp. a case with an opng, a RA extending out from the opng, smcdr shs each having a dpt ion-impted into at least one sh and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, and w. the det. is adapted to provide a det. resolution of less than or equal to 125, 120, 115, 110, 105, 100, 95, 90, 85, 80, or 75 KeV.

exmpr287. A nu det. comp. a case with an opng, a RA extending out from the opng, a smcdr sh having a coating and comp. elecs, w. the sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr288. A nu det. comp. a case with an opng, a RA extending out from the opng, a smcdr sh having a coating and comp. elecs, w. the sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr289. A nu det. comp. a case with an opng, a RA extending out from the opng, a smcdr sh having a coating and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, and w. the det. is adapted to provide a det. resolution of less than or equal to 125, 120, 115, 110, 105, 100, 95, 90, 85, 80, or 75 KeV.

exmpr290. A nu det. comp. a case with an opng, a RA extending out from the opng, a smcdr sh with a dpt ion-impted into the sh and comp. elecs, w. the sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr291. A nu det. comp. a case with an opng, a RA extending out from the opng, a smcdr sh with a dpt ion-impted into the sh and comp. elecs, w. the sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr292. A nu det. comp. a case with an opng, a RA extending out from the opng, a smcdr sh with a dpt ion-impted into the sh and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, and w. the det. is adapted to provide a det. resolution of less than or equal to 125, 120, 115, 110, 105, 100, 95, 90, 85, 80, or 75 KeV.

exmpr293. A nu det. comp. a case with an opng, a RA extending out from the opng, smcdr shs at least one sh comp. elecs, w. the at least one sh sits perp to the RA w. the elecs con to the supporting electronics, and w. the det. is adapted to provide a det. resolution of less than or equal to 125, 120, 115, 110, 105, 100, 95, 90, 85, 80, or 75 KeV.

exmpr294. A nu det. comp. a case with an opng, a RA extending out from the opng, smcdr shs at least one sh comp. elecs and a coating, w. the at least one sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr295. A nu det. comp. a case with an opng, a RA extending out from the opng, smcdr shs at least one sh comp. elecs and a coating, w. the at least one sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr296. A nu det. comp. a case with an opng, a RA extending out from the opng, smcdr shs at least one sh comp. elecs and a coating, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, and w. the det. is adapted to provide a det. resolution of less than or equal to 125, 120, 115, 110, 105, 100, 95, 90, 85, 80, or 75 KeV.

exmpr297. A nu det. comp. a case with an opng, a RA extending out from the opng, smcdr shs having a dpt ion-impted into at least one sh and comp. elecs, w. the at least one sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr298. A nu det. comp. a case with an opng, a RA extending out from the opng, smcdr shs having a dpt ion-impted into at least one sh and comp. elecs, w. the at least one sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV.

exmpr299. A nu det. comp. a case with an opng, a RA extending out from the opng, smcdr shs having a dpt ion-impted into at least one sh and comp. elecs, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, and w. the det. is adapted to provide a det. resolution of less than or equal to 125, 120, 115, 110, 105, 100, 95, 90, 85, 80, or 75 KeV.

exmpr300. A nu det. comp. a case with an opng, a RA extending out from the opng, PV shs each comp. elecs, w. the shs stack coaxially along the RA perp to the RA w. the elecs con to the supporting electronics, and w. the det. is adapted to provide a det. resolution of less than or equal to 125, 120, 115, 110, 105, 100, 95, 90, 85, 80, or 75 KeV.

exmpr301. A nu det. comp. a case with an opng, a RA extending out from the opng, PV shs each having a coating and comp. elecs, w. the shs stack coaxially along the RA perp to the RA w. the elecs con to the supporting electronics, and w. the det. is adapted to provide a det. resolution of less than or equal to 125, 120, 115, 110, 105, 100, 95, 90, 85, 80, or 75 KeV.

exmpr302. A nu det. comp. a case with an opng, a RA extending out from the opng, PV shs each having a coating and comp. elecs, w. the shs stack coaxially along the RA perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C.

86xexmpr1. A nu det. comp. a case with an opng, a RA extending out from the opng, PV shs each having a coating and comp. elecs, w. the shs stack coaxially along the RA perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C.

exmpr303. A nu det. comp. a case with an opng, a RA extending out from the opng, PV shs each having a coating and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr304. A nu det. comp. a case with an opng, a RA extending out from the opng, PV shs each having a dpt ion-impted into at least one sh and comp. elecs, w. the shs stack coaxially along the RA perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr305. A nu det. comp. a case with an opng, a RA extending out from the opng, PV shs each having a dpt ion-impted into at least one sh and comp. elecs, w. the shs stack coaxially along the RA perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr306. A nu det. comp. a case with an opng, a RA extending out from the opng, PV shs each having a dpt ion-impted into at least one sh and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr307. A nu det. comp. a case with an opng, a RA extending out from the opng, a PV sh having a coating and comp. elecs, w. the sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr308. A nu det. comp. a case with an opng, a RA extending out from the opng, a PV sh having a coating and comp. elecs, w. the sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C. 91×1. A nu det. comp. a case with an opng, a RA extending out from the opng, a PV sh having a coating and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr309. A nu det. comp. a case with an opng, a RA extending out from the opng, a PV sh with a dpt ion-impted into the sh and comp. elecs, w. the sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr310. A nu det. comp. a case with an opng, a RA extending out from the opng, a PV sh with a dpt ion-impted into the sh and comp. elecs, w. the sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr311. A nu det. comp. a case with an opng, a RA extending out from the opng, a PV sh with a dpt ion-impted into the sh and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr312. A nu det. comp. a case with an opng, a RA extending out from the opng, PV shs at least one sh comp. elecs, w. the at least one sh sits perp to the RA w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr313. A nu det. comp. a case with an opng, a RA extending out from the opng, PV shs at least one sh comp. elecs and a coating, w. the at least one sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr314. A nu det. comp. a case with an opng, a RA extending out from the opng, PV shs at least one sh comp. elecs and a coating, w. the at least one sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr315. A nu det. comp. a case with an opng, a RA extending out from the opng, PV shs at least one sh comp. elecs and a coating, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr316. A nu det. comp. a case with an opng, a RA extending out from the opng, PV shs having a dpt ion-impted into at least one sh and comp. elecs, w. the at least one sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr317. A nu det. comp. a case with an opng, a RA extending out from the opng, PV shs having a dpt ion-impted into at least one sh and comp. elecs, w. the at least one sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr318. A nu det. comp. a case with an opng, a RA extending out from the opng, PV shs having a dpt ion-impted into at least one sh and comp. elecs, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr319. A nu det. comp. a case with an opng, a RA extending out from the opng, smcdr shs each comp. elecs, w. the shs stack coaxially along the RA perp to the RA w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr320. A nu det. comp. a case with an opng, a RA extending out from the opng, smcdr shs each having a coating and comp. elecs, w. the shs stack coaxially along the RA perp to the RA w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr321. A nu det. comp. a case with an opng, a RA extending out from the opng, smcdr shs each having a coating and comp. elecs, w. the shs stack coaxially along the RA perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C. A nu det. comp. a case with an opng, a RA extending out from the opng, smcdr shs each having a coating and comp. elecs, w. the shs stack coaxially along the RA perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr322. A nu det. comp. a case with an opng, a RA extending out from the opng, smcdr shs each having a coating and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr323. A nu det. comp. a case with an opng, a RA extending out from the opng, smcdr shs each having a dpt ion-impted into at least one sh and comp. elecs, w. the shs stack coaxially along the RA perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr324. A nu det. comp. a case with an opng, a RA extending out from the opng, smcdr shs each having a dpt ion-impted into at least one sh and comp. elecs, w. the shs stack coaxially along the RA perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr325. A nu det. comp. a case with an opng, a RA extending out from the opng, smcdr shs each having a dpt ion-impted into at least one sh and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C. A nu det. comp. a case with an opng, a RA extending out from the opng, a smcdr sh having a coating and comp. elecs, w. the sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr326. A nu det. comp. a case with an opng, a RA extending out from the opng, a smcdr sh having a coating and comp. elecs, w. the sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr327. A nu det. comp. a case with an opng, a RA extending out from the opng, a smcdr sh having a coating and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr328. A nu det. comp. a case with an opng, a RA extending out from the opng, a smcdr sh with a dpt ion-impted into the sh and comp. elecs, w. the sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr329. A nu det. comp. a case with an opng, a RA extending out from the opng, a smcdr sh with a dpt ion-impted into the sh and comp. elecs, w. the sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr330. A nu det. comp. a case with an opng, a RA extending out from the opng, a smcdr sh with a dpt ion-impted into the sh and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr331. A nu det. comp. a case with an opng, a RA extending out from the opng, smcdr shs at least one sh comp. elecs, w. the at least one sh sits perp to the RA w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr332. A nu det. comp. a case with an opng, a RA extending out from the opng, smcdr shs at least one sh comp. elecs and a coating, w. the at least one sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr333. A nu det. comp. a case with an opng, a RA extending out from the opng, smcdr shs at least one sh comp. elecs and a coating, w. the at least one sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr334. A nu det. comp. a case with an opng, a RA extending out from the opng, smcdr shs at least one sh comp. elecs and a coating, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr335. A nu det. comp. a case with an opng, a RA extending out from the opng, smcdr shs having a dpt ion-impted into at least one sh and comp. elecs, w. the at least one sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr336. A nu det. comp. a case with an opng, a RA extending out from the opng, smcdr shs having a dpt ion-impted into at least one sh and comp. elecs, w. the at least one sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C. when the det. is cooled below 0 degrees C.

exmpr337. A nu det. comp. a case with an opng, a RA extending out from the opng, smcdr shs having a dpt ion-impted into at least one sh and comp. elecs, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C.

exmpr338. A nu det. comp. a case with an opng, a RA extending out from the opng, PV shs each comp. elecs, w. the shs stack coaxially along the RA perp to the RA w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C.

exmpr339. A nu det. comp. a case with an opng, a RA extending out from the opng, PV shs each having a coating and comp. elecs, w. the shs stack coaxially along the RA perp to the RA w. the elecs con to the supporting electronics, and w. the det. is adapted to provide a det. resolution of less than or equal to 125, 120, 115, 110, 105, 100, 95, 90, 85, 80, or 75 KeV when the det. is cooled below 0 degrees C.

exmpr340. A nu det. comp. a case with an opng, a RA extending out from the opng, PV shs each having a coating and comp. elecs, w. the shs stack coaxially along the RA perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr341. A nu det. comp. a case with an opng, a RA extending out from the opng, PV shs each having a coating and comp. elecs, w. the shs stack coaxially along the RA perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr342. A nu det. comp. a case with an opng, a RA extending out from the opng, PV shs each having a coating and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr343. A nu det. comp. a case with an opng, a RA extending out from the opng, PV shs each having a dpt ion-impted into at least one sh and comp. elecs, w. the shs stack coaxially along the RA perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr344. A nu det. comp. a case with an opng, a RA extending out from the opng, PV shs each having a dpt ion-impted into at least one sh and comp. elecs, w. the shs stack coaxially along the RA perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr345. A nu det. comp. a case with an opng, a RA extending out from the opng, PV shs each having a dpt ion-impted into at least one sh and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C. A nu det. comp. a case with an opng, a RA extending out from the opng, a PV sh having a coating and comp. elecs, w. the sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr346. A nu det. comp. a case with an opng, a RA extending out from the opng, a PV sh having a coating and comp. elecs, w. the sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr347. A nu det. comp. a case with an opng, a RA extending out from the opng, a PV sh having a coating and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr348. A nu det. comp. a case with an opng, a RA extending out from the opng, a PV sh with a dpt ion-impted into the sh and comp. elecs, w. the sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr349. A nu det. comp. a case with an opng, a RA extending out from the opng, a PV sh with a dpt ion-impted into the sh and comp. elecs, w. the sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C. A nu det. comp. a case with an opng, a RA extending out from the opng, a PV sh with a dpt ion-impted into the sh and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr350. A nu det. comp. a case with an opng, a RA extending out from the opng, PV shs at least one sh comp. elecs, w. the at least one sh sits perp to the RA w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr351. A nu det. comp. a case with an opng, a RA extending out from the opng, PV shs at least one sh comp. elecs and a coating, w. the at least one sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr352. A nu det. comp. a case with an opng, a RA extending out from the opng, PV shs at least one sh comp. elecs and a coating, w. the at least one sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr353. A nu det. comp. a case with an opng, a RA extending out from the opng, PV shs at least one sh comp. elecs and a coating, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr354. A nu det. comp. a case with an opng, a RA extending out from the opng, PV shs having a dpt ion-impted into at least one sh and comp. elecs, w. the at least one sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr355. A nu det. comp. a case with an opng, a RA extending out from the opng, PV shs having a dpt ion-impted into at least one sh and comp. elecs, w. the at least one sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr356. A nu det. comp. a case with an opng, a RA extending out from the opng, PV shs having a dpt ion-impted into at least one sh and comp. elecs, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, w. the det. is adapted to measure nus with energy of 0.1-20, 0.1-10, 0.3-8, or 0.4-5 MeV, and w. the det. is adapted to provide a det.

resolution of less than or equal to 125, 120, 115, 110, 105, 100, 95, 90, 85, 80, or 75 KeV when the det. is cooled below 0 degrees C.

exmpr357. A nu det. comp. a case with an opng, a RA extending out from the opng, smcdr shs each comp. elecs, w. the shs stack coaxially along the RA perp to the RA w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr358. A nu det. comp. a case with an opng, a RA extending out from the opng, smcdr shs each having a coating and comp. elecs, w. the shs stack coaxially along the RA perp to the RA w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr359. A nu det. comp. a case with an opng, a RA extending out from the opng, smcdr shs each having a coating and comp. elecs, w. the shs stack coaxially along the RA perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr360. A nu det. comp. a case with an opng, a RA extending out from the opng, smcdr shs each having a coating and comp. elecs, w. the shs stack coaxially along the RA perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr361. A nu det. comp. a case with an opng, a RA extending out from the opng, smcdr shs each having a coating and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C. A nu det. comp. a case with an opng, a RA extending out from the opng, smcdr shs each having a dpt ion-impted into at least one sh and comp. elecs, w. the shs stack coaxially along the RA perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr362. A nu det. comp. a case with an opng, a RA extending out from the opng, smcdr shs each having a dpt ion-impted into at least one sh and comp. elecs, w. the shs stack coaxially along the RA perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr363. A nu det. comp. a case with an opng, a RA extending out from the opng, smcdr shs each having a dpt ion-impted into at least one sh and comp. elecs, w. the shs stack coaxially along the RA perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr364. A nu det. comp. a case with an opng, a RA extending out from the opng, a smcdr sh having a coating and comp. elecs, w. the sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr365. A nu det. comp. a case with an opng, a RA extending out from the opng, a smcdr sh having a coating and comp. elecs, w. the sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr366. A nu det. comp. a case with an opng, a RA extending out from the opng, a smcdr sh having a coating and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AIP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr367. A nu det. comp. a case with an opng, a RA extending out from the opng, a smcdr sh with a dpt ion-impted into the sh and comp. elecs, w. the sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr368. A nu det. comp. a case with an opng, a RA extending out from the opng, a smcdr sh with a dpt ion-impted into the sh and comp. elecs, w. the sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr369. A nu det. comp. a case with an opng, a RA extending out from the opng, a smcdr sh with a dpt ion-impted into the sh and comp. elecs, w. the sh sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr370. A nu det. comp. a case with an opng, a RA extending out from the opng, smcdr shs at least one sh comp. elecs, w. the at least one sh sits perp to the RA w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C. A nu det. comp. a case with an opng, a RA extending out from the opng, smcdr shs at least one sh comp. elecs and a coating, w. the at least one sh sits perp to the RA, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr371. A nu det. comp. a case with an opng, a RA extending out from the opng, smcdr shs at least one sh comp. elecs and a coating, w. the at least one sh sits perp to the RA, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr372. A nu det. comp. a case with an opng, a RA extending out from the opng, smcdr shs at least one sh comp. elecs and a coating, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr373. A nu det. comp. a case with an opng, a RA extending out from the opng, smcdr shs having a dpt ion-impted into at least one sh and comp. elecs, w. the at least one sh sits perp to the RA, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr374. A nu det. comp. a case with an opng, a RA extending out from the opng, smcdr shs having a dpt ion-impted into at least one sh and comp. elecs, w. the at least one sh sits perp to the RA, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C. A nu det. comp. a case with an opng, a RA extending out from the opng, smcdr shs having a dpt ion-impted into at least one sh and comp. elecs, w. the at least one sh sits perp to the RA, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr375. A nu det. comp. a case with an opng, a RA extending out from the opng, PV shs each comp. elecs, w. the shs stack coaxially along the RA perp to the RA w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr376. A nu det. comp. a case with an opng, a RA extending out from the opng, PV shs each having a coating and comp. elecs, w. the shs stack coaxially along the RA perp to the RA w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr377. A nu det. comp. a case with an opng and PV shs each having a coating and comp. elecs, w. the shs stack along an axis, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr378. A nu det. comp. a case with an opng and PV shs each having a coating and comp. elecs, w. the shs stack along an axis, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr379. A nu det. comp. a case with an opng and PV shs each having a coating and comp. elecs, w. the shs stack along an axis, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr380. A nu det. comp. a case with an opng and PV shs each having a dpt ion-impted into at least one sh and comp. elecs, w. the shs stack along an axis, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr381. A nu det. comp. a case with an opng and PV shs each having a dpt ion-impted into at least one sh and comp. elecs, w. the shs stack along an axis, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C. A nu det. comp. a case with an opng and PV shs each having a dpt ion-impted into at least one sh and comp. elecs, w. the shs stack along an axis, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr382. A nu det. comp. a case with an opng and a PV sh having a coating and comp. elecs, w. the sh sits perp to an axis, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr383. A nu det. comp. a case with an opng and a PV sh having a coating and comp. elecs, w. the sh sits perp to an axis, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr384. A nu det. comp. a case with an opng and a PV sh having a coating and comp. elecs, w. the sh sits perp to an axis, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr385. A nu det. comp. a case with an opng and a PV sh with a dpt ion-impted into the sh and comp. elecs, w. the sh sits perp to an axis, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr386. A nu det. comp. a case with an opng and a PV sh with a dpt ion-impted into the sh and comp. elecs, w. the sh sits perp to an axis, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr387. A nu det. comp. a case with an opng and a PV sh with a dpt ion-impted into the sh and comp. elecs, w. the sh sits perp to an axis, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr388. A nu det. comp. a case with an opng and PV shs at least one sh comp. elecs, w. the at least one sh sits perp to an axis w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr389. A nu det. comp. a case with an opng and PV shs at least one sh comp. elecs and a coating, w. the at least one sh sits perp to an axis, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr390. A nu det. comp. a case with an opng and PV shs at least one sh comp. elecs and a coating, w. the at least one sh sits perp to an axis, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr391. A nu det. comp. a case with an opng and PV shs at least one sh comp. elecs and a coating, w. the at least one sh sits perp to an axis, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr392. A nu det. comp. a case with an opng and PV shs having a dpt ion-impted into at least one sh and comp. elecs, w. the at least one sh sits perp to an axis, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr393. A nu det. comp. a case with an opng and PV shs having a dpt ion-impted into at least one sh and comp. elecs, w. the at least one sh sits perp to an axis, w. the dpt COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr394. A nu det. comp. a case with an opng and PV shs having a dpt ion-impted into at least one sh and comp. elecs, w. the at least one sh sits perp to an axis, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr395. A nu det. comp. a case with an opng and smcdr shs each comp. elecs, w. the shs stack along an axis w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr396. A nu det. comp. a case with an opng and smcdr shs each having a coating and comp. elecs, w. the shs stack along an axis w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr397. A nu det. comp. a case with an opng and smcdr shs each having a coating and comp. elecs, w. the shs stack along an axis, w. the coating COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr398. A nu det. comp. a case with an opng and smcdr shs each having a coating and comp. elecs, w. the shs stack along an axis, w. the coating COMS a mat. selected from any one or any COMB of the following: Ba, As, Ce, Co, Cu, Ga, Ge, In, Cd, Al, K, La, Mo, Nd, Os, Pr, I, Sn, Sr, Ti, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr399. A nu det. comp. a case with an opng and smcdr shs each having a coating and comp. elecs, w. the shs stack along an axis, w. the coating COMS a mat. selected from any one or any COMB of the following: Ti ox, Zn ox, Sn ox, CIGdSe, cadtel, cadt ox, perovskite PV, Si, GaAs, AlP, Ge, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr400. A nu det. comp. a case with an opng and smcdr shs each having a dpt ion-impted into at least one sh and comp. elecs, w. the shs stack along an axis, w. the dpt COMS a mat. selected from any one or any COMB of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr, w. the elecs con to the supporting electronics, w. the det. is adapted to measure nus with energy of 0.1-20, 0.1-10, 0.3-8, or 0.4-5 MeV, and w. the det. is adapted to provide a det. resolution of less than or equal to 125, 120, 115, 110, 105, 100, 95, 90, 85, 80, or 75 KeV when the det. is cooled below 0 degrees C.

exmpr401. A nu det. having a PV sh comp. elecs w. the det. has a live state and a dead state in which in the live state, the sh has a non-zero VLT drop across the sh and a dead state in which the VLT drop across the sh is less than the VLT drop across the sh in the live state w. det. electronics are adapted to measure the VLT drop and changes in the VLT drop caused by a nu undergoing a NR with the PV sh.

exmpr402. The det. of exmpr 401 w. the det. COMS a first sh and a second sh.

exmpr403. The det. of exmpr 402 w. the det. COMS shs.

exmpr404. The det. of exmpr 403 w. the plurality of shs COMS elecs.

exmpr405. The det. of exmpr 404 w. the VLT drop across at least two of the shs is less than 5, 1, 0.5, or 0.1 mV.

exmpr406. The det. of exmpr 405 w. the first sh has a first VLT drop and the second sh has a second VLT drop.

exmpr407. The det. of exmpr 406 w. the first VLT drop is>the second VLT drop.

exmpr408. The det. of exmpr 403 means for accounting for at least one nu that escapes a volume of the det. before the nu energy falls below the level at which the det. can detect the nu.

exmpr409. The det. of exmpr 408 w. shs are selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr410. The det. of exmpr 408 w. shs are selected from any one or any COMB of the following Ba, As, Ce, Co, Cu, Ga, Ge, In, Cd, Al, K, La, Mo, Nd, Os, Pr, I, Sn, Sr, Ti, V, Zn, and Zr.

exmpr411. The det. of exmpr 410 w. shs are selected from any one or any COMB of the following Ti ox, Zn ox, Sn ox, CIGdSe, cadtel, cadt ox, perovskite PV, Si, GaAs, AIP, and Ge.

exmpr412. A meth. of meas. a HE nu flux comp. placing a glass fiber in the flux and meas. a photon produced when a nu of the flux of nus undergoes a NR with the Si of the glass.

exmpr413. A meth. of meas. a HE nu flux comp. placing a glass fiber in the flux and meas. a photon produced when a nu of the flux of nus intrts with the Si of the glass.

exmpr414. A meth. of meas. a HE nu flux comp. placing a glass fiber containing a dpt in the flux and meas. a photon produced when a nu of the flux of nus undergoes a NR with the dpt.

exmpr415. The meth. of exmpr 414 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr416. The meth. of exmpr 415 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr417. A meth. of meas. a HE nu flux comp. placing a glass fiber containing a dpt in the flux and meas. a photon produced when a nu of the flux of nus intrts with the dpt.

exmpr418. The meth. of exmpr 417 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr419. The meth. of exmpr 418 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr420. A meth. of detecting a HE nu flux comp. placing a glass fiber in the flux and detecting a photon produced when a nu of the flux of nus undergoes a NR with the Si of the glass.

exmpr421. A meth. of detecting a HE nu flux comp. placing a glass fiber in the flux and detecting a photon produced when a nu of the flux of nus intrts with the Si of the glass.

exmpr422. A meth. of detecting a HE nu flux comp. placing a glass fiber containing a dpt in the flux and detecting a photon produced when a nu of the flux of nus undergoes a NR with the dpt.

exmpr423. The meth. of exmpr 422 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr424. The meth. of exmpr 423 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr425. A meth. of detecting a HE nu flux comp. placing a glass fiber containing a dpt in the flux and detecting a photon produced when a nu of the flux of nus intrts with the dpt.

exmpr426. The meth. of exmpr 425 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr427. The meth. of exmpr 426 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr428. A meth. of detecting a HE nu flux comp. placing a glass fiber in the flux and detecting a photon produced when a nu of the flux of nus undergoes a NR with the Si of the glass, w. the photon is detected after it travels a distance through the glass fiber.

exmpr429. A meth. of detecting a HE nu flux comp. placing a glass fiber in the flux and detecting a photon produced when a nu of the flux of nus intrts with the Si of the glass, w. the photon is detected after it travels a distance through the glass fiber.

exmpr430. A meth. of detecting a HE nu flux comp. placing a glass fiber containing a dpt in the flux and detecting a photon produced when a nu of the flux of nus undergoes a NR with the dpt, w. the photon is detected after it travels a distance through the glass fiber.

exmpr431. The meth. of exmpr 430 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr432. The meth. of exmpr 431 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr433. A meth. of detecting a HE nu flux comp. placing a glass fiber containing a dpt in the flux and detecting a photon produced when a nu of the flux of nus intrts with the dpt, w. the photon is detected after it travels a distance through the glass fiber.

exmpr434. The meth. of exmpr 433 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr435. The meth. of exmpr 434 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr436. A meth. of detecting a HE nu flux comp. placing a glass fiber in the flux and detecting a photon produced when a nu of the flux of nus undergoes a NR with the Si of the glass, w. the photon is detected using a photodiode.

exmpr437. A meth. of detecting a HE nu flux comp. placing a glass fiber in the flux and detecting a photon produced when a nu of the flux of nus intrts with the Si of the glass, w. the photon is detected using a photodiode.

exmpr438. A meth. of detecting a HE nu flux comp. placing a glass fiber containing a dpt in the flux and detecting a photon produced when a nu of the flux of nus undergoes a NR with the dpt, w. the photon is detected using a photodiode.

exmpr439. The meth. of exmpr 438 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr440. The meth. of exmpr 439 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr441. A meth. of detecting a HE nu flux comp. placing a glass fiber containing a dpt in the flux and detecting a photon produced when a nu of the flux of nus intrts with the dpt, w. the photon is detected using a photodiode.

exmpr442. The meth. of exmpr 441 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr443. The meth. of exmpr 442 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr444. A meth. of detecting a HE nu flux comp. placing a glass fiber in the flux and detecting a photon produced when a nu of the flux of nus undergoes a NR with the Si of the glass, w. the photon is detected using a photomultiplier tube.

exmpr445. A meth. of detecting a HE nu flux comp. placing a glass fiber in the flux and detecting a photon produced when a nu of the flux of nus intrts with the Si of the glass, w. the photon is detected using a photomultiplier tube.

exmpr446. A meth. of detecting a HE nu flux comp. placing a glass fiber containing a dpt in the flux and detecting a photon produced when a nu of the flux of nus undergoes a NR with the dpt, w. the photon is detected using a photomultiplier tube.

exmpr447. The meth. of exmpr 446 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr448. The meth. of exmpr 447 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr449. A meth. of detecting a HE nu flux comp. placing a glass fiber containing a dpt in the flux and detecting a photon produced when a nu of the flux of nus intrts with the dpt, w. the photon is detected using a photomultiplier tube.

exmpr450. The meth. of exmpr 449 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr451. The meth. of exmpr 450 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr452. A meth. of detecting a HE nu flux comp. placing a glass fiber in the flux and detecting a photon produced when a nu of the flux of nus undergoes a NR with the Si of the glass, w. the photon is detected using a Si photomultiplier.

exmpr453. A meth. of detecting a HE nu flux comp. placing a glass fiber in the flux and detecting a photon produced when a nu of the flux of nus intrts with the Si of the glass, w. the photon is detected using a Si photomultiplier.

exmpr454. A meth. of detecting a HE nu flux comp. placing a glass fiber containing a dpt in the flux and detecting a photon produced when a nu of the flux of nus undergoes a NR with the dpt, w. the photon is detected using a Si photomultiplier.

exmpr455. The meth. of exmpr 454 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr456. The meth. of exmpr 455 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr457. A meth. of detecting a HE nu flux comp. placing a glass fiber containing a dpt in the flux and detecting a photon produced when a nu of the flux of nus intrts with the dpt, w. the photon is detected using a Si photomultiplier.

exmpr458. The meth. of exmpr 457 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr459. The meth. of exmpr 458 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr460. A meth. of detecting a HE nu flux comp. placing a glass fiber in the flux and detecting a photon produced when a nu of the flux of nus undergoes a NR with the Si of the glass, w. the photon is detected using a charge-coupled device.

exmpr461. A meth. of detecting a HE nu flux comp. placing a glass fiber in the flux and detecting a photon produced when a nu of the flux of nus intrts with the Si of the glass, w. the photon is detected using a charge-coupled device.

exmpr462. A meth. of detecting a HE nu flux comp. placing a glass fiber containing a dpt in the flux and detecting a photon produced when a nu of the flux of nus undergoes a NR with the dpt, w. the photon is detected using a charge-coupled device.

exmpr463. The meth. of exmpr 462 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr464. The meth. of exmpr 463 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr465. A meth. of detecting a HE nu flux comp. placing a glass fiber containing a dpt in the flux and detecting a photon produced when a nu of the flux of nus intrts with the dpt, w. the photon is detected using a charge-coupled device.

exmpr466. The meth. of exmpr 465 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr467. The meth. of exmpr 466 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr468. A meth. of detecting a HE nu flux comp. placing a glass fiber in the flux and detecting a photon produced when a nu of the flux of nus undergoes a NR with the Si of the glass, w. the photon is detected using film.

exmpr469. A meth. of detecting a HE nu flux comp. placing a glass fiber in the flux and detecting a photon produced when a nu of the flux of nus intrts with the Si of the glass, w. the photon is detected using film.

exmpr470. A meth. of detecting a HE nu flux comp. placing a glass fiber containing a dpt in the flux and detecting a photon produced when a nu of the flux of nus undergoes a NR with the dpt, w. the photon is detected using film.

exmpr471. The meth. of exmpr 470 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr472. The meth. of exmpr 471 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr473. A meth. of detecting a HE nu flux comp. placing a glass fiber containing a dpt in the flux and detecting a photon produced when a nu of the flux of nus intrts with the dpt, w. the photon is detected using film.

exmpr474. The meth. of exmpr 473 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr475. The meth. of exmpr 474 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr476. A meth. of detecting a HE nu flux comp. placing a glass fiber in the flux and detecting a photon produced when a nu of the flux of nus undergoes a NR with the Si of the glass, w. the photon is detected after it travels 0.1 mm or more through the glass fiber.

exmpr477. A meth. of detecting a HE nu flux comp. placing a glass fiber in the flux and detecting a photon produced when a nu of the flux of nus intrts with the Si of the glass, w. the photon is detected after it travels 0.1 mm or more through the glass fiber.

exmpr478. A meth. of detecting a HE nu flux comp. placing a glass fiber containing a dpt in the flux and detecting a photon produced when a nu of the flux of nus undergoes a NR with the dpt, w. the photon is detected after it travels 0.1 mm or more through the glass fiber.

exmpr479. The meth. of exmpr 478 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr480. The meth. of exmpr 479 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr481. A meth. of detecting a HE nu flux comp. placing a glass fiber containing a dpt in the flux and detecting a photon produced when a nu of the flux of nus intrts with the dpt, w. the photon is detected after it travels 0.1 mm or more through the glass fiber.

exmpr482. The meth. of exmpr 481 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr483. The meth. of exmpr 482 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr484. A meth. of detecting a HE nu flux comp. placing a glass fiber in the flux and detecting a photon produced when a nu of the flux of nus undergoes a NR with the Si of the glass, w. the photon is detected after it travels 1 mm or more through the glass fiber.

exmpr485. A meth. of detecting a HE nu flux comp. placing a glass fiber in the flux and detecting a photon produced when a nu of the flux of nus intrts with the Si of the glass, w. the photon is detected after it travels 1 mm or more through the glass fiber.

exmpr486. A meth. of detecting a HE nu flux comp. placing a glass fiber containing a dpt in the flux and detecting a photon produced when a nu of the flux of nus undergoes a NR with the dpt, w. the photon is detected after it travels 1 mm or more through the glass fiber.

exmpr487. The meth. of exmpr 485 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr488. The meth. of exmpr 487 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr489. A meth. of detecting a HE nu flux comp. placing a glass fiber containing a dpt in the flux and detecting a photon produced when a nu of the flux of nus intrts with the dpt, w. the photon is detected after it travels 1 mm or more through the glass fiber.

exmpr490. The meth. of exmpr 489 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr491. The meth. of exmpr 490 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr492. A meth. of detecting a HE nu flux comp. placing a glass fiber in the flux and detecting a photon produced when a nu of the flux of nus undergoes a NR with the Si of the glass, w. the photon is detected after it travels 1 cm or more through the glass fiber.

exmpr493. A meth. of detecting a HE nu flux comp. placing a glass fiber in the flux and detecting a photon produced when a nu of the flux of nus intrts with the Si of the glass, w. the photon is detected after it travels 1 cm or more through the glass fiber.

exmpr494. A meth. of detecting a HE nu flux comp. placing a glass fiber containing a dpt in the flux and detecting a photon produced when a nu of the flux of nus undergoes a NR with the dpt, w. the photon is detected after it travels 1 cm or more through the glass fiber.

exmpr495. The meth. of exmpr 494 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr496. The meth. of exmpr 495 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr497. A meth. of detecting a HE nu flux comp. placing a glass fiber containing a dpt in the flux and detecting a photon produced when a nu of the flux of nus intrts with the dpt, w. the photon is detected after it travels 1 cm or more through the glass fiber.

exmpr498. The meth. of exmpr 497 w. the dpt is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr499. The meth. of exmpr 498 w. the dpt is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr500. A meth. of meas. a HE nu flux comp. placing a thkns of a PV mat. in the flux and meas. a signal produced when a nu of the flux of nus undergoes a NR with the PV mat.

exmpr501. A meth. of meas. a HE nu flux comp. placing a thkns of a PV mat. in the flux and meas. a signal produced by the IR produced when a nu of the flux of nus undergoes a NR with the PV mat.

exmpr502. A meth. of meas. a HE nu flux comp. placing a thkns of a PV mat. in the flux and meas. a signal produced when a nu of the flux of nus intrts with the PV mat.

exmpr503. A meth. of meas. a HE nu flux comp. placing a thkns of a PV mat. in the flux and meas. a signal produced by the IR produced when a nu of the flux of nus intrts with the PV mat.

exmpr504. A meth. of meas. a HE nu flux comp. placing a thkns of a PV mat. in the flux and meas. a VLT produced when a nu of the flux of nus undergoes a NR with the PV mat.

exmpr505. A meth. of meas. a HE nu flux comp. placing a thkns of a PV mat. in the flux and meas. a VLT produced by the IR produced when a nu of the flux of nus undergoes a NR with the PV mat.

exmpr506. A meth. of meas. a HE nu flux comp. placing a thkns of a PV mat. in the flux and meas. a VLT produced when a nu of the flux of nus intrts with the PV mat.

exmpr507. A meth. of meas. a HE nu flux comp. placing a thkns of a PV mat. in the flux and meas. a VLT produced by the IR produced when a nu of the flux of nus intrts with the PV mat.

exmpr508. A meth. of meas. a HE nu flux comp. placing a thkns of a PV mat. in the flux and meas. a VLT produced when a nu of the flux of nus undergoes a NR with the PV mat. w. the PV mat. of the PV mat. of the PV mat. is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr509. A meth. of meas. a HE nu flux comp. placing a thkns of a PV mat. in the flux and meas. a VLT produced by the IR produced when a nu of the flux of nus undergoes a NR with the PV mat. w. the PV mat. of the PV mat. is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr510. A meth. of meas. a HE nu flux comp. placing a thkns of a PV mat. in the flux and meas. a VLT produced when a nu of the flux of nus intrts with the PV mat. w. the PV mat. of the PV mat. is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr511. A meth. of meas. a HE nu flux comp. placing a thkns of a PV mat. in the flux and meas. a VLT produced by the IR produced when a nu of the flux of nus intrts with the PV mat. w. the PV mat. of the PV mat. is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr512. A meth. of meas. a HE nu flux comp. placing a thkns of a PV mat. in the flux and meas. a VLT produced when a nu of the flux of nus undergoes a NR with the PV mat. w. the PV mat. of the PV mat. is selected from any one or any COMB of the following Ti ox, Zn ox, Sn ox, CIGdSe, cadtel, Cadt ox, perovskite PV, Si, GaAs, AlP, Ge.

exmpr513. A meth. of meas. a HE nu flux comp. placing a thkns of a PV mat. in the flux and meas. a VLT produced by the IR produced when a nu of the flux of nus undergoes a NR with the PV mat. w. the PV mat. of the PV mat. is selected from any one or any COMB of the following Ti ox, Zn ox, Sn ox, CIGdSe, cadtel, Cadt ox, perovskite PV, Si, GaAs, AlP, Ge.

exmpr514. A meth. of meas. a HE nu flux comp. placing a thkns of a PV mat. in the flux and meas. a VLT produced when a nu of the flux of nus intrts with the PV mat. w. the PV mat. of the PV mat. is selected from any one or any COMB of the following Ti ox, Zn ox, Sn ox, CIGdSe, cadtel, Cadt ox, perovskite PV, Si, GaAs, AlP, Ge.

exmpr515. A meth. of meas. a HE nu flux comp. placing a thkns of a PV mat. in the flux and meas. a VLT produced by the IR produced when a nu of the flux of nus intrts with the PV mat. w. the PV mat. of the PV mat. is selected from any one or any COMB of the following Ti ox, Zn ox, Sn ox, CIGdSe, cadtel, Cadt ox, perovskite PV, Si, GaAs, AlP, Ge.

exmpr516. A meth. of meas. a HE nu flux comp. placing a thkns of a PV mat. in the flux and meas. a VLT produced when a nu of the flux of nus undergoes a NR with the PV mat. w. the PV mat. is selected from any one or any COMB of the following Ti ox, Zn ox, Sn ox, CIGdSe, cadtel, Cadt ox, perovskite PV, Si, GaAs, AlP, Ge.

exmpr517. A meth. of meas. a HE nu flux comp. placing a thkns of a PV mat. in the flux and meas. a VLT produced when a nu of the flux of nus undergoes a NR with the PV mat. w. the PV mat. is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr518. A meth. of meas. a HE nu flux comp. placing a thkns of a PV mat. in the flux and meas. a VLT produced when a nu of the flux of nus undergoes a NR with the PV mat. w. the PV mat. is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr519. A meth. of meas. a HE nu flux comp. placing a thkns of a PV mat. in the flux and meas. a VLT produced by the IR produced when a nu of the flux of nus undergoes a NR with the PV mat. w. the PV mat. is selected from any one or any COMB of the following Ti ox, Zn ox, Sn ox, CIGdSe, cadtel, Cadt ox, perovskite PV, Si, GaAs, AlP, Ge.

exmpr520. A meth. of meas. a HE nu flux comp. placing a thkns of a PV mat. in the flux and meas. a VLT produced by the IR produced when a nu of the flux of nus undergoes a NR with the PV mat. w. the PV mat. is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr521. A meth. of meas. a HE nu flux comp. placing a thkns of a PV mat. in the flux and meas. a VLT produced by the IR produced when a nu of the flux of nus undergoes a NR with the PV mat. w. the PV mat. is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr522. A meth. of meas. a HE nu flux comp. placing a thkns of a PV mat. in the flux and meas. a VLT produced when a nu of the flux of nus intrts with the PV mat. w. the PV mat. is selected from any one or any COMB of the following Ti ox, Zn ox, Sn ox, CIGdSe, cadtel, Cadt ox, perovskite PV, Si, GaAs, AIP, Ge.

exmpr523. A meth. of meas. a HE nu flux comp. placing a thkns of a PV mat. in the flux and meas. a VLT produced when a nu of the flux of nus intrts with the PV mat. w. the PV mat. is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr524. A meth. of meas. a HE nu flux comp. placing a thkns of a PV mat. in the flux and meas. a VLT produced when a nu of the flux of nus intrts with the PV mat. w. the PV mat. is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr525. A meth. of meas. a HE nu flux comp. placing a thkns of a PV mat. in the flux and meas. a VLT produced by the IR produced when a nu of the flux of nus intrts with the PV mat. w. the PV mat. is selected from any one or any COMB of the following Ti ox, Zn ox, Sn ox, CIGdSe, cadtel, Cadt ox, perovskite PV, Si, GaAs, AIP, Ge.

exmpr526. A meth. of meas. a HE nu flux comp. placing a thkns of a PV mat. in the flux and meas. a VLT produced by the IR produced when a nu of the flux of nus intrts with the PV mat. w. the PV mat. is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr527. A meth. of meas. a HE nu flux comp. placing a thkns of a PV mat. in the flux and meas. a VLT produced by the IR produced when a nu of the flux of nus intrts with the PV mat. w. the PV mat. is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, TI, V, Zn, and Zr.

exmpr528. A meth. of meas. a HE nu flux comp. placing a sen comp. 2-20 thknses of a PV mat. stacked on each other in the flux and meas. a signal produced when a nu of the flux of nus undergoes a NR with the PV mat., w. the mat. has a wdw for receiving nus at an end and a length of the mat. perp to the wdw>the height and width of the wdw.

exmpr529. A meth. of meas. a HE nu flux comp. placing a sen comp. 2-20 thknses of a PV mat. stacked on each other in the flux and meas. a signal produced by the IR produced when a nu of the flux of nus undergoes a NR with the PV mat., w. the mat. has a wdw for receiving nus at an end and a length of the mat. perp to the wdw>the height and width of the wdw.

exmpr530. A meth. of meas. a HE nu flux comp. placing a sen comp. 2-20 thknses of a PV mat. stacked on each other in the flux and meas. a signal produced when a nu of the flux of nus intrts with the PV mat., w. the mat. has a wdw for receiving nus at an end and a length of the mat. perp to the wdw>the height and width of the wdw.

exmpr531. A meth. of meas. a HE nu flux comp. placing a sen comp. 2-20 thknses of a PV mat. stacked on each other in the flux and meas. a signal produced by the IR produced when a nu of the flux of nus intrts with the PV mat., w. the mat. has a wdw for receiving nus at an end and a length of the mat. perp to the wdw>the height and width of the wdw.

exmpr532. A meth. of meas. a HE nu flux comp. placing a sen comp. 2-20 thknses of a PV mat. stacked on each other in the flux and meas. a VLT produced when a nu of the flux of nus undergoes a NR with the PV mat., w. the mat. has a wdw for receiving nus at an end and a length of the mat. perp to the wdw>the height and width of the wdw.

exmpr533. A meth. of meas. a HE nu flux comp. placing a sen comp. 2-20 thknses of a PV mat. stacked on each other in the flux and meas. a VLT produced by the IR produced when a nu of the flux of nus undergoes a NR with the PV mat., w. the mat. has a wdw for receiving nus at an end and a length of the mat. perp to the wdw>the height and width of the wdw.

exmpr534. A meth. of meas. a HE nu flux comp. placing a sen comp. 2-20 thknses of a PV mat. stacked on each other in the flux and meas. a VLT produced when a nu of the flux of nus intrts with the PV mat., w. the mat. has a wdw for receiving nus at an end and a length of the mat. perp to the wdw>the height and width of the wdw.

exmpr535. A meth. of meas. a HE nu flux comp. placing a sen comp. 2-20 thknses of a PV mat. stacked on each other in the flux and meas. a VLT produced by the IR produced when a nu of the flux of nus intrts with the PV mat., w. the mat. has a wdw for receiving nus at an end and a length of the mat. perp to the wdw>the height and width of the wdw.

exmpr536. A meth. of meas. a HE nu flux comp. placing a sen comp. PV mat. in the flux and meas. a signal produced when a nu of the flux of nus undergoes a NR with the PV mat., w. the mat. has a wdw for receiving nus at an end and a length of the mat. perp to the wdw>the height and width of the wdw.

exmpr537. A meth. of meas. a HE nu flux comp. placing a thkns of a PV mat. in the flux and meas. a signal produced by the IR produced when a nu of the flux of nus undergoes a NR with the PV mat., w. the mat. has a wdw for receiving nus at an end and a length of the mat. perp to the wdw>the height and width of the wdw.

exmpr538. A meth. of meas. a HE nu flux comp. placing a thkns of a PV mat. in the flux and meas. a signal produced when a nu of the flux of nus intrts with the PV mat., w. the mat. has a wdw for receiving nus at an end and a length of the mat. perp to the wdw>the height and width of the wdw.

exmpr539. A meth. of meas. a HE nu flux comp. placing a thkns of a PV mat. in the flux and meas. a signal produced by the IR produced when a nu of the flux of nus intrts with the PV mat., w. the mat. has a wdw for receiving nus at an end and a length of the mat. perp to the wdw>the height and width of the wdw.

exmpr540. A meth. of meas. a HE nu flux comp. placing a thkns of a PV mat. in the flux and meas. a VLT produced when a nu of the flux of nus undergoes a NR with the PV mat., w. the mat. has a wdw for receiving nus at an end and a length of the mat. perp to the wdw>the height and width of the wdw.

exmpr541. A meth. of meas. a HE nu flux comp. placing a thkns of a PV mat. in the flux and meas. a VLT produced by the IR produced when a nu of the flux of nus undergoes a NR with the PV mat., w. the mat. has a wdw for receiving nus at an end and a length of the mat. perp to the wdw>the height and width of the wdw.

exmpr542. A meth. of meas. a HE nu flux comp. placing a thkns of a PV mat. in the flux and meas. a VLT produced when a nu of the flux of nus intrts with the PV mat., w. the mat. has a wdw for receiving nus at an end and a length of the mat. perp to the wdw>the height and width of the wdw.

exmpr543. A meth. of meas. a HE nu flux comp. placing a thkns of a PV mat. in the flux and meas. a VLT produced by the IR produced when a nu of the flux of nus intrts with the PV mat., w. the mat. has a wdw for receiving nus at an end and a length of the mat. perp to the wdw>the height and width of the wdw.

exmpr544. A meth. of meas. a HE nu flux comp. placing a sen comp. a PV mat. in the flux and meas. a signal produced when a nu of the flux of nus undergoes a NR with the PV mat., w. the mat. has a wdw for receiving nus at an end and a length of the mat. perp to the wdw>the height and width of the wdw.

exmpr545. A meth. of meas. a HE nu flux comp. placing a sen comp. a PV mat. in the flux and meas. a signal produced by the IR produced when a nu of the flux of nus undergoes a NR with the PV mat., w. the mat. has a wdw for receiving nus at an end and a length of the mat. perp to the wdw>the height and width of the wdw.

exmpr546. A meth. of meas. a HE nu flux comp. placing a sen comp. a PV mat. in the flux and meas. a signal produced when a nu of the flux of nus intrts with the PV mat., w. the mat. has a wdw for receiving nus at an end and a length of the mat. perp to the wdw>the height and width of the wdw.

exmpr547. A meth. of meas. a HE nu flux comp. placing a sen comp. a PV mat. in the flux and meas. a signal produced by the IR produced when a nu of the flux of nus intrts with the PV mat., w. the mat. has a wdw for receiving nus at an end and a length of the mat. perp to the wdw>the height and width of the wdw.

exmpr548. A meth. of meas. a HE nu flux comp. placing a sen comp. a PV mat. in the flux and meas. a VLT produced when a nu of the flux of nus undergoes a NR with the PV mat., w. the mat. has a wdw for receiving nus at an end and a length of the mat. perp to the wdw>the height and width of the wdw.

exmpr549. A meth. of meas. a HE nu flux comp. placing a sen comp. a PV mat. in the flux and meas. a VLT produced by the IR produced when a nu of the flux of nus undergoes a NR with the PV mat., w. the mat. has a wdw for receiving nus at an end and a length of the mat. perp to the wdw>the height and width of the wdw.

exmpr550. A meth. of meas. a HE nu flux comp. placing a sen comp. a PV mat. in the flux and meas. a VLT produced when a nu of the flux of nus intrts with the PV mat., w. the mat. has a wdw for receiving nus at an end and a length of the mat. perp to the wdw>the height and width of the wdw.

exmpr551. A meth. of meas. a HE nu flux comp. placing a sen comp. a PV mat. in the flux and meas. a VLT produced by the IR produced when a nu of the flux of nus intrts with the PV mat., w. the mat. has a wdw for receiving nus at an end and a length of the mat. perp to the wdw>the height and width of the wdw.

53xexmpr4., A meth. of meas. a HE nu flux comp. placing a sen comp. a PV mat. in the flux and meas. a signal produced when a nu of the flux of nus undergoes a NR with the PV mat.

exmpr552. A meth. of meas. a HE nu flux comp. placing a sen comp. a PV mat. in the flux and meas. a signal produced by the IR produced when a nu of the flux of nus undergoes a NR with the PV mat.

exmpr553. A meth. of meas. a HE nu flux comp. placing a sen comp. a PV mat. in the flux and meas. a signal produced when a nu of the flux of nus intrts with the PV mat.

exmpr554. A meth. of meas. a HE nu flux comp. placing a sen comp. a PV mat. in the flux and meas. a signal produced by the IR produced when a nu of the flux of nus intrts with the PV mat.

exmpr555. A meth. of meas. a HE nu flux comp. placing a sen comp. a PV mat. in the flux and meas. a VLT produced when a nu of the flux of nus undergoes a NR with the PV mat.

exmpr556. A meth. of meas. a HE nu flux comp. placing a sen comp. a PV mat. in the flux and meas. a VLT produced by the IR produced when a nu of the flux of nus undergoes a NR with the PV mat.

exmpr557. A meth. of meas. a HE nu flux comp. placing a sen comp. a PV mat. in the flux and meas. a VLT produced when a nu of the flux of nus intrts with the PV mat.

exmpr558. A meth. of meas. a HE nu flux comp. placing a sen comp. a PV mat. in the flux and meas. a VLT produced by the IR produced when a nu of the flux of nus intrts with the PV mat.

exmpr559. A meth. of meas. a HE nu flux comp. placing a thkns of a PV mat. in the flux and meas. a VLT produced when a nu of the flux of nus undergoes a NR with the PV mat.

exmpr560. A meth. of meas. a HE nu flux comp. placing a thkns of a PV mat. in the flux and meas. a VLT produced by the IR produced when a nu of the flux of nus undergoes a NR with the PV mat.

exmpr561. A meth. of meas. a HE nu flux comp. placing a thkns of a PV mat. in the flux and meas. a VLT produced when a nu of the flux of nus intrts with the PV mat.

exmpr562. A meth. of meas. a HE nu flux comp. placing a thkns of a PV mat. in the flux and meas. a VLT produced by the IR produced when a nu of the flux of nus intrts with the PV mat.

exmpr563. A meth. of meas. a HE nu flux comp. placing a thkns of a PV mat. in the flux and meas. a VLT produced when a nu of the flux of nus undergoes a NR with the PV mat. w. the PV mat. is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr564. A meth. of meas. a HE nu flux comp. placing a thkns of a PV mat. in the flux and meas. a VLT produced by the IR produced when a nu of the flux of nus undergoes a NR with the PV mat. w. the PV mat. is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr565. A meth. of meas. a HE nu flux comp. placing a thkns of a PV mat. in the flux and meas. a VLT produced when a nu of the flux of nus intrts with the PV mat. w. the PV mat. is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr566. A meth. of meas. a HE nu flux comp. placing a thkns of a PV mat. in the flux and meas. a VLT produced by the IR produced when a nu of the flux of nus intrts with the PV mat. w. the PV mat. is selected from any one or any COMB of the following Ba, As, Ce, Co, Cu, Ga, Ge, In, Cd, Al, K, La, Mo, Nd, Os, Pr, i, Sn, Sr, Ti, V, Zn, and Zr.

exmpr567. A meth. of meas. a HE nu flux comp. placing a thkns of a PV mat. in the flux and meas. a VLT produced when a nu of the flux of nus undergoes a NR with the PV mat. w. the PV mat. is selected from any one or any COMB of the following Ti ox, Zn ox, Sn ox, CIGdSe, cadtel, Cadt ox, perovskite PV, Si, GaAs, AlP, Ge.

exmpr568. A meth. of meas. a HE nu flux comp. placing a thkns of a PV mat. in the flux and meas. a VLT produced by the IR produced when a nu of the flux of nus undergoes a NR with the PV mat. w. the PV mat. is selected from any one or any COMB of the following Ti ox, Zn ox, Sn ox, CIGdSe, cadtel, Cadt ox, perovskite PV, Si, GaAs, AlP, Ge.

exmpr569. A meth. of meas. a HE nu flux comp. placing a thkns of a PV mat. in the flux and meas. a VLT produced when a nu of the flux of nus intrts with the PV mat. w. the PV mat. is selected from any one or any COMB of the following Ti ox, Zn ox, Sn ox, CIGdSe, cadtel, Cadt ox, perovskite PV, Si, GaAs, AlP, Ge.

exmpr570. A meth. of meas. a HE nu flux comp. placing a thkns of a PV mat. in the flux and meas. a VLT produced by the IR produced when a nu of the flux of nus intrts with the PV mat. w. the PV mat. is selected from any one or any COMB of the following Ti ox, Zn ox, Sn ox, CIGdSe, cadtel, Cadt ox, perovskite PV, Si, GaAs, AlP, Ge.

exmpr571. A meth. of meas. a HE nu flux comp. placing a thkns of a PV mat. in the flux and meas. a VLT produced when a nu of the flux of nus undergoes a NR with the PV mat. w. the PV mat. is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr.

exmpr572. A meth. of meas. a HE nu flux comp. placing a thkns of a PV mat. in the flux and meas. a VLT produced by the IR produced when a nu of the flux of nus undergoes a NR with the PV mat. w. the PV mat. is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr.

exmpr573. A meth. of meas. a HE nu flux comp. placing a thkns of a PV mat. in the flux and meas. a VLT produced when a nu of the flux of nus intrts with the PV mat. w. the PV mat. is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr.

exmpr574. A meth. of meas. a HE nu flux comp. placing a thkns of a PV mat. in the flux and meas. a VLT produced by the IR produced when a nu of the flux of nus intrts with the PV mat. w. the PV mat. is selected from any one or any COMB of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr.

exmpr575. The meth. of any of the preceding exmprs w. the thkns is a det. like a passivated planar impted Si detector, with the Si replaced with one or more of Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr.

exmpr576. The meth. of exmprs 412-17×3 w. the thkns is a det. like a passivated planar impted Si detector, with the Si replaced with one or more of Ba, As, Ce, Co, Cu, Ga, Ge, In, Cd, Al, K, La, Mo, Nd, Os, Pr, i, Sn, Sr, Ti, V, Zn, and Zr.

exmpr577. The meth. of exmprs 412-17×3 w. the thkns is a det. like a passivated planar impted Si detector, with the Si replaced with one or more of Ti ox, Zn ox, Sn ox, CIGdSe, cadtel, Cadt ox, perovskite PV, Si, GaAs, AlP, Ge.

exmpr578. The meth. of exmprs 412-17×3 w. the thkns is a Si photomultiplier.

exmpr579. A meth. of meas. a HE nu flux comp. placing a sen comp. 2-20×3 thknses of a PV mat. stacked on each other in the flux and meas. a signal produced when a nu of the flux of nus undergoes a NR with the PV mat., w. the mat. has a wdw for receiving nus at an end and a length of the mat. perp to the wdw >the height and width of the wdw.

exmpr580. A meth. of meas. a HE nu flux comp. placing a sen comp. 2-20 thknses of a PV mat. stacked on each other in the flux and meas. a signal produced by the IR produced when a nu of the flux of nus undergoes a NR with the PV mat., w. the mat. has a wdw for receiving nus at an end and a length of the mat. perp to the wdw>the height and width of the wdw.

exmpr581. A meth. of meas. a HE nu flux comp. placing a sen comp. 2-20 thknses of a PV mat. stacked on each other in the flux and meas. a signal produced when a nu of the flux of nus intrts with the PV mat., w. the mat. has a wdw for receiving nus at an end and a length of the mat. perp to the wdw>the height and width of the wdw.

exmpr582. A meth. of meas. a HE nu flux comp. placing a sen comp. 2-20 thknses of a PV mat. stacked on each other in the flux and meas. a signal produced by the IR produced when a nu of the flux of nus intrts with the PV mat., w. the mat. has a wdw for receiving nus at an end and a length of the mat. perp to the wdw>the height and width of the wdw.

exmpr583. A meth. of meas. a HE nu flux comp. placing a sen comp. 2-20 thknses of a PV mat. stacked on each other in the flux and meas. a VLT produced when a nu of the flux of nus undergoes a NR with the PV mat., w. the mat. has a wdw for receiving nus at an end and a length of the mat. perp to the wdw >the height and width of the wdw.

exmpr584. A meth. of meas. a HE nu flux comp. placing a sen comp. 2-20 thknses of a PV mat. stacked on each other in the flux and meas. a VLT produced by the IR produced when a nu of the flux of nus undergoes a NR with the PV mat., w. the mat. has a wdw for receiving nus at an end and a length of the mat. perp to the wdw>the height and width of the wdw.

exmpr585. A meth. of meas. a HE nu flux comp. placing a sen comp. 2-20 thknses of a PV mat. stacked on each other in the flux and meas. a VLT produced when a nu of the flux of nus intrts with the PV mat., w. the mat. has a wdw for receiving nus at an end and a length of the mat. perp to the wdw>the height and width of the wdw.

exmpr586. A meth. of meas. a HE nu flux comp. placing a sen comp. 2-20 thknses of a PV mat. stacked on each other in the flux and meas. a VLT produced by the IR produced when a nu of the flux of nus intrts with the PV mat., w. the mat. has a wdw for receiving nus at an end and a length of the mat. perp to the wdw>the height and width of the wdw.

exmpr587. A meth. of meas. a HE nu flux comp. placing a sen comp. PV mat. in the flux and meas. a signal produced when a nu of the flux of nus undergoes a NR with the PV mat., w. the mat. has a wdw for receiving nus at an end and a length of the mat. perp to the wdw>the height and width of the wdw.

exmpr588. A meth. of meas. a HE nu flux comp. placing a thkns of a PV mat. in the flux and meas. a signal produced by the IR produced when a nu of the flux of nus undergoes a NR with the PV mat., w. the mat. has a wdw for receiving nus at an end and a length of the mat. perp to the wdw>the height and width of the wdw.

exmpr589. A meth. of meas. a HE nu flux comp. placing a thkns of a PV mat. in the flux and meas. a signal produced when a nu of the flux of nus intrts with the PV mat., w. the mat. has a wdw for receiving nus at an end and a length of the mat. perp to the wdw>the height and width of the wdw.

exmpr590. A meth. of meas. a HE nu flux comp. placing a thkns of a PV mat. in the flux and meas. a signal produced by the IR produced when a nu of the flux of nus intrts with the PV mat., w. the mat. has a wdw for receiving nus at an end and a length of the mat. perp to the wdw>the height and width of the wdw.

exmpr591. A meth. of meas. a HE nu flux comp. placing a thkns of a PV mat. in the flux and meas. a VLT produced when a nu of the flux of nus undergoes a NR with the PV mat., w. the mat. has a wdw for receiving nus at an end and a length of the mat. perp to the wdw>the height and width of the wdw.

exmpr592. A meth. of meas. a HE nu flux comp. placing a thkns of a PV mat. in the flux and meas. a VLT produced by the IR produced when a nu of the flux of nus undergoes a NR with the PV mat., w. the mat. has a wdw for receiving nus at an end and a length of the mat. perp to the wdw>the height and width of the wdw.

exmpr593. A meth. of meas. a HE nu flux comp. placing a thkns of a PV mat. in the flux and meas. a VLT produced when a nu of the flux of nus intrts with the PV mat., w. the mat. has a wdw for receiving nus at an end and a length of the mat. perp to the wdw>the height and width of the wdw.

exmpr594. A meth. of meas. a HE nu flux comp. placing a thkns of a PV mat. in the flux and meas. a VLT produced by the IR produced when a nu of the flux of nus intrts with the PV mat., w. the mat. has a wdw for receiving nus at an end and a length of the mat. perp to the wdw>the height and width of the wdw.

exmpr595. A meth. of meas. a HE nu flux comp. placing a sen comp. a PV mat. in the flux and meas. a signal produced when a nu of the flux of nus undergoes a NR with the PV mat., w. the mat. has a wdw for receiving nus at an end and a length of the mat. perp to the wdw>the height and width of the wdw.

exmpr596. A meth. of meas. a HE nu flux comp. placing a sen comp. a PV mat. in the flux and meas. a signal produced by the IR produced when a nu of the flux of nus undergoes a NR with the PV mat., w. the mat. has a wdw for receiving nus at an end and a length of the mat. perp to the wdw>the height and width of the wdw.

exmpr597. A meth. of meas. a HE nu flux comp. placing a sen comp. a PV mat. in the flux and meas. a signal produced when a nu of the flux of nus intrts with the PV mat., w. the mat. has a wdw for receiving nus at an end and a length of the mat. perp to the wdw>the height and width of the wdw.

exmpr598. A meth. of meas. a HE nu flux comp. placing a sen comp. a PV mat. in the flux and meas. a signal produced by the IR produced when a nu of the flux of nus intrts with the PV mat., w. the mat. has a wdw for receiving nus at an end and a length of the mat. perp to the wdw>the height and width of the wdw.

exmpr599. A meth. of meas. a HE nu flux comp. placing a sen comp. a PV mat. in the flux and meas. a VLT produced when a nu of the flux of nus undergoes a NR with the PV mat., w. the mat. has a wdw for receiving nus at an end and a length of the mat. perp to the wdw>the height and width of the wdw.

exmpr600. A meth. of meas. a HE nu flux comp. placing a sen comp. a PV mat. in the flux and meas. a VLT produced by the IR produced when a nu of the flux of nus undergoes a NR with the PV mat., w. the mat. has a wdw for receiving nus at an end and a length of the mat. perp to the wdw>the height and width of the wdw.

exmpr601. A meth. of meas. a HE nu flux comp. placing a sen comp. a PV mat. in the flux and meas. a VLT produced when a nu of the flux of nus intrts with the PV mat., w. the mat. has a wdw for receiving nus at an end and a length of the mat. perp to the wdw>the height and width of the wdw.

exmpr602. A meth. of meas. a HE nu flux comp. placing a sen comp. a PV mat. in the flux and meas. a VLT produced by the IR produced when a nu of the flux of nus intrts with the PV mat., w. the mat. has a wdw for receiving nus at an end and a length of the mat. perp to the wdw>the height and width of the wdw.

exmpr603. A meth. of meas. a HE nu flux comp. placing a sen comp. a PV mat. in the flux and meas. a signal produced when a nu of the flux of nus undergoes a NR with the PV mat.

exmpr604. A meth. of meas. a HE nu flux comp. placing a sen comp. a PV mat. in the flux and meas. a signal produced by the IR produced when a nu of the flux of nus undergoes a NR with the PV mat.

exmpr605. A meth. of meas. a HE nu flux comp. placing a sen comp. a PV mat. in the flux and meas. a signal produced when a nu of the flux of nus intrts with the PV mat.

exmpr606. A meth. of meas. a HE nu flux comp. placing a sen comp. a PV mat. in the flux and meas. a signal produced by the IR produced when a nu of the flux of nus intrts with the PV mat.

exmpr607. A meth. of meas. a HE nu flux comp. placing a sen comp. a PV mat. in the flux and meas. a VLT produced when a nu of the flux of nus undergoes a NR with the PV mat.

exmpr608. A meth. of meas. a HE nu flux comp. placing a sen comp. a PV mat. in the flux and meas. a VLT produced by the IR produced when a nu of the flux of nus undergoes a NR with the PV mat.

exmpr610. A meth. of meas. a HE nu flux comp. placing a sen comp. a PV mat. in the flux and meas. a VLT produced by the IR produced when a nu of the flux of nus intrts with the PV mat.

exmpr611. A meth. of meas. a HE nu flux comp. placing a sen comp. 2-20 thknses of a PV mat. stacked on each other in the flux and meas. a signal produced when a nu of the flux of nus undergoes a NR with the PV mat., w. the mat. has a wdw for receiving nus at an end and a length of the mat. perp to the wdw >the height and width of the wdw and w. the length is 6-60, 7-50, or 5-40 cm.

exmpr612. A meth. of meas. a HE nu flux comp. placing a sen comp. 2-20 thknses of a PV mat. stacked on each other in the flux and meas. a signal produced by the IR produced when a nu of the flux of nus undergoes a NR with the PV mat., w. the mat. has a wdw for receiving nus at an end and a length of the mat. perp to the wdw>the height and width of the wdw and w. the length is 6-60, 7-50, or 5-40 cm.

exmpr613. A meth. of meas. a HE nu flux comp. placing a sen comp. 2-20 thknses of a PV mat. stacked on each other in the flux and meas. a signal produced when a nu of the flux of nus intrts with the PV mat., w. the mat. has a wdw for receiving nus at an end and a length of the mat. perp to the wdw>the height and width of the wdw and w. the length is 6-60, 7-50, or 5-40 cm.

exmpr614. A meth. of meas. a HE nu flux comp. placing a sen comp. 2-20 thknses of a PV mat. stacked on each other in the flux and meas. a signal produced by the IR produced when a nu of the flux of nus intrts with the PV mat., w. the mat. has a wdw for receiving nus at an end and a length of the mat. perp to the wdw>the height and width of the wdw and w. the length is 6-60, 7-50, or 5-40 cm.

exmpr615. A meth. of meas. a HE nu flux comp. placing a sen comp. 2-20 thknses of a PV mat. stacked on each other in the flux and meas. a VLT produced when a nu of the flux of nus undergoes a NR with the PV mat., w. the mat. has a wdw for receiving nus at an end and a length of the mat. perp to the wdw >the height and width of the wdw and w. the length is 6-60, 7-50, or 5-40 cm.

exmpr616. A meth. of meas. a HE nu flux comp. placing a sen comp. 2-20 thknses of a PV mat. stacked on each other in the flux and meas. a VLT produced by the IR produced when a nu of the flux of nus undergoes a NR with the PV mat., w. the mat. has a wdw for receiving nus at an end and a length of the mat. perp to the wdw>the height and width of the wdw and w. the length is 6-60, 7-50, or 5-40 cm.

exmpr617. A meth. of meas. a HE nu flux comp. placing a sen comp. 2-20 thknses of a PV mat. stacked on each other in the flux and meas. a VLT produced when a nu of the flux of nus intrts with the PV mat., w. the mat. has a wdw for receiving nus at an end and a length of the mat. perp to the wdw>the height and width of the wdw and w. the length is 6-60, 7-50, or 5-40 cm.

exmpr618. A meth. of meas. a HE nu flux comp. placing a sen comp. 2-20 thknses of a PV mat. stacked on each other in the flux and meas. a VLT produced by the IR produced when a nu of the flux of nus intrts with the PV mat., w. the mat. has a wdw for receiving nus at an end and a length of the mat. perp to the wdw>the height and width of the wdw and w. the length is 6-60, 7-50, or 5-40 cm.

exmpr619. A meth. of meas. a HE nu flux comp. placing a sen comp. PV mat. in the flux and meas. a signal produced when a nu of the flux of nus undergoes a NR with the PV mat., w. the mat. has a wdw for receiving nus at an end and a length of the mat. perp to the wdw>the height and width of the wdw and w. the length is 6-60, 7-50, or 5-40 cm.

exmpr620. A meth. of meas. a HE nu flux comp. placing a thkns of a PV mat. in the flux and meas. a signal produced by the IR produced when a nu of the flux of nus undergoes a NR with the PV mat., w. the mat. has a wdw for receiving nus at an end and a length of the mat. perp to the wdw>the height and width of the wdw and w. the length is 6-60, 7-50, or 5-40 cm.

exmpr621. A meth. of meas. a HE nu flux comp. placing a thkns of a PV mat. in the flux and meas. a signal produced when a nu of the flux of nus intrts with the PV mat., w. the mat. has a wdw for receiving nus at an end and a length of the mat. perp to the wdw>the height and width of the wdw and w. the length is 6-60, 7-50, or 5-40 cm.

exmpr622. A meth. of meas. a HE nu flux comp. placing a thkns of a PV mat. in the flux and meas. a signal produced by the IR produced when a nu of the flux of nus intrts with the PV mat., w. the mat. has a wdw for receiving nus at an end and a length of the mat. perp to the wdw>the height and width of the wdw and w. the length is 6-60, 7-50, or 5-40 cm.

exmpr623. A meth. of meas. a HE nu flux comp. placing a thkns of a PV mat. in the flux and meas. a VLT produced when a nu of the flux of nus undergoes a NR with the PV mat., w. the mat. has a wdw for receiving nus at an end and a length of the mat. perp to the wdw>the height and width of the wdw and w. the length is 6-60, 7-50, or 5-40 cm.

exmpr624. A meth. of meas. a HE nu flux comp. placing a thkns of a PV mat. in the flux and meas. a VLT produced by the IR produced when a nu of the flux of nus undergoes a NR with the PV mat., w. the mat. has a wdw for receiving nus at an end and a length of the mat. perp to the wdw>the height and width of the wdw and w. the length is 6-60, 7-50, or 5-40 cm.

exmpr625. A meth. of meas. a HE nu flux comp. placing a thkns of a PV mat. in the flux and meas. a VLT produced when a nu of the flux of nus intrts with the PV mat., w. the mat. has a wdw for receiving nus at an end and a length of the mat. perp to the wdw>the height and width of the wdw and w. the length is 6-60, 7-50, or 5-40 cm.

exmpr626. A meth. of meas. a HE nu flux comp. placing a thkns of a PV mat. in the flux and meas. a VLT produced by the IR produced when a nu of the flux of nus intrts with the PV mat., w. the mat. has a wdw for receiving nus at an end and a length of the mat. perp to the wdw>the height and width of the wdw and w. the length is 6-60, 7-50, or 5-40 cm.

exmpr627. A meth. of meas. a HE nu flux comp. placing a sen comp. a PV mat. in the flux and meas. a signal produced when a nu of the flux of nus undergoes a NR with the PV mat., w. the mat. has a wdw for receiving nus at an end and a length of the mat. perp to the wdw>the height and width of the wdw and w. the length is 6-60, 7-50, or 5-40 cm.

exmpr628. A meth. of meas. a HE nu flux comp. placing a sen comp. a PV mat. in the flux and meas. a signal produced by the IR produced when a nu of the flux of nus undergoes a NR with the PV mat., w. the mat. has a wdw for receiving nus at an end and a length of the mat. perp to the wdw>the height and width of the wdw and w. the length is 6-60, 7-50, or 5-40 cm.

exmpr629. A meth. of meas. a HE nu flux comp. placing a sen comp. a PV mat. in the flux and meas. a signal produced when a nu of the flux of nus intrts with the PV mat., w. the mat. has a wdw for receiving nus at an end and a length of the mat. perp to the wdw>the height and width of the wdw and w. the length is 6-60, 7-50, or 5-40 cm.

exmpr630. A meth. of meas. a HE nu flux comp. placing a sen comp. a PV mat. in the flux and meas. a signal produced by the IR produced when a nu of the flux of nus intrts with the PV mat., w. the mat. has a wdw for receiving nus at an end and a length of the mat. perp to the wdw>the height and width of the wdw and w. the length is 6-60, 7-50, or 5-40 cm.

exmpr631. A meth. of meas. a HE nu flux comp. placing a sen comp. a PV mat. in the flux and meas. a VLT produced when a nu of the flux of nus undergoes a NR with the PV mat., w. the mat. has a wdw for receiving nus at an end and a length of the mat. perp to the wdw>the height and width of the wdw and w. the length is 6-60, 7-50, or 5-40 cm.

exmpr632. A meth. of meas. a HE nu flux comp. placing a sen comp. a PV mat. in the flux and meas. a VLT produced by the IR produced when a nu of the flux of nus undergoes a NR with the PV mat., w. the mat. has a wdw for receiving nus at an end and a length of the mat. perp to the wdw>the height and width of the wdw and w. the length is 6-60, 7-50, or 5-40 cm.

exmpr633. A meth. of meas. a HE nu flux comp. placing a sen comp. a PV mat. in the flux and meas. a VLT produced when a nu of the flux of nus intrts with the PV mat., w. the mat. has a wdw for receiving nus at an end and a length of the mat. perp to the wdw>the height and width of the wdw and w. the length is 6-60, 7-50, or 5-40 cm.

exmpr634. A meth. of meas. a HE nu flux comp. placing a sen comp. a PV mat. in the flux and meas. a VLT produced by the IR produced when a nu of the flux of nus intrts with the PV mat., w. the mat. has a wdw for receiving nus at an end and a length of the mat. perp to the wdw>the height and width of the wdw and w. the length is 6-60, 7-50, or 5-40 cm.

exmpr635. A meth. of meas. a HE nu flux comp. placing a sen comp. 2-20 thknses of a PV mat. stacked on each other in the flux and meas. a signal produced when a nu of the flux of nus undergoes a NR with the PV mat., w. the mat. has a wdw for receiving nus at an end and a length of the mat. perp to the wdw >the height and width of the wdw, w. the length is 6-60, 7-50, or 5-40 cm, and w. the det. COMS a γ-ray filter.

exmpr636. A meth. of meas. a HE nu flux comp. placing a sen comp. 2-20 thknses of a PV mat. stacked on each other in the flux and meas. a signal produced by the IR produced when a nu of the flux of nus undergoes a NR with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr637. A meth. of meas. a HE nu flux comp. placing a sen comp. 2-20 thknses of a PV mat. stacked on each other in the flux and meas. a signal produced when a nu of the flux of nus intrts with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr638. A meth. of meas. a HE nu flux comp. placing a sen comp. 2-20 thknses of a PV mat. stacked on each other in the flux and meas. a signal produced by the IR produced when a nu of the flux of nus intrts with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr639. A meth. of meas. a HE nu flux comp. placing a sen comp. 2-20 thknses of a PV mat. stacked on each other in the flux and meas. a VLT produced when a nu of the flux of nus undergoes a NR with the PV mat., w. the mat. has a wdw for receiving nus at an end and a length of the mat. perp to the wdw >the height and width of the wdw, w. the length is 6-60, 7-50, or 5-40 cm, and w. the det. COMS a γ-ray filter.

exmpr640. A meth. of meas. a HE nu flux comp. placing a sen comp. 2-20 thknses of a PV mat. stacked on each other in the flux and meas. a VLT produced by the IR produced when a nu of the flux of nus undergoes a NR with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr641. A meth. of meas. a HE nu flux comp. placing a sen comp. 2-20 thknses of a PV mat. stacked on each other in the flux and meas. a VLT produced when a nu of the flux of nus intrts with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr642. A meth. of meas. a HE nu flux comp. placing a sen comp. 2-20 thknses of a PV mat. stacked on each other in the flux and meas. a VLT produced by the IR produced when a nu of the flux of nus intrts with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr643. A meth. of meas. a HE nu flux comp. placing a sen comp. PV mat. in the flux and meas. a signal produced when a nu of the flux of nus undergoes a NR with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr644. A meth. of meas. a HE nu flux comp. placing a thkns of a PV mat. in the flux and meas. a signal produced by the IR produced when a nu of the flux of nus undergoes a NR with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr645. A meth. of meas. a HE nu flux comp. placing a thkns of a PV mat. in the flux and meas. a signal produced when a nu of the flux of nus intrts with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr646. A meth. of meas. a HE nu flux comp. placing a thkns of a PV mat. in the flux and meas. a signal produced by the IR produced when a nu of the flux of nus intrts with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr647. A meth. of meas. a HE nu flux comp. placing a thkns of a PV mat. in the flux and meas. a VLT produced when a nu of the flux of nus undergoes a NR with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr648. A meth. of meas. a HE nu flux comp. placing a thkns of a PV mat. in the flux and meas. a VLT produced by the IR produced when a nu of the flux of nus undergoes a NR with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr649. A meth. of meas. a HE nu flux comp. placing a thkns of a PV mat. in the flux and meas. a VLT produced when a nu of the flux of nus intrts with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr650. A meth. of meas. a HE nu flux comp. placing a thkns of a PV mat. in the flux and meas. a VLT produced by the IR produced when a nu of the flux of nus intrts with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr651. A meth. of meas. a HE nu flux comp. placing a sen comp. a PV mat. in the flux and meas. a signal produced when a nu of the flux of nus undergoes a NR with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr652. A meth. of meas. a HE nu flux comp. placing a sen comp. a PV mat. in the flux and meas. a signal produced by the IR produced when a nu of the flux of nus undergoes a NR with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr653. A meth. of meas. a HE nu flux comp. placing a sen comp. a PV mat. in the flux and meas. a signal produced when a nu of the flux of nus intrts with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

156×4xexmpr4. A meth. of meas. a HE nu flux comp. placing a sen comp. a PV mat. in the flux and meas. a signal produced by the IR produced when a nu of the flux of nus intrts with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr654. A meth. of meas. a HE nu flux comp. placing a sen comp. a PV mat. in the flux and meas. a VLT produced when a nu of the flux of nus undergoes a NR with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr655. A meth. of meas. a HE nu flux comp. placing a sen comp. a PV mat. in the flux and meas. a VLT produced by the IR produced when a nu of the flux of nus undergoes a NR with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr656. A meth. of meas. a HE nu flux comp. placing a sen comp. a PV mat. in the flux and meas. a VLT produced when a nu of the flux of nus intrts with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

exmpr657. A meth. of meas. a HE nu flux comp. placing a sen comp. a PV mat. in the flux and meas. a VLT produced by the IR produced when a nu of the flux of nus intrts with the PV mat., w. the mat. has a wdw for receiving nus at an end and a length of the mat. perp to the wdw>the height and width of the wdw, w. the length is 6-60, 7-50, or 5-40 cm, and w. the det. COMS a γ-ray filter.

The invention claimed is:

1. A neutron detector comprising a case with an opening, wherein a receiving axis extends out from the opening, and a first photovoltaic sheet comprising electrodes, wherein one or more photovoltaic sheets including the first photovoltaic sheet are stacked coaxially along the receiving axis perpendicular to the receiving axis and wherein the electrodes connect to supporting electronics,
   wherein the neutron detector has a live state and a dead state, and
   wherein, when the neutron detector is in the live state, one or more of the first photovoltaic sheet has a non-zero voltage drop across the first photovoltaic sheet and, when the neutron detector is in the dead state, the first photovoltaic sheet has a voltage drop across the first photovoltaic sheet that is less than the voltage drop across the first photovoltaic sheet when the neutron detector is in the live state, and wherein the supporting electronics are adapted to measure a voltage drop across the first photovoltaic sheet and changes in the voltage drop caused by a neutron undergoing a nuclear reaction within the first photovoltaic sheet.

2. The neutron detector of claim 1, the one or more photovoltaic sheets comprising two or more photovoltaic sheets.

3. The neutron detector of claim 2, wherein the one or more photovoltaic sheets further comprise a coating.

4. The neutron detector of claim 3, wherein the coating comprises a material selected from any one or any combination of the following: Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr.

5. A method of measuring a high-energy neutron flux comprising placing a detector comprising a glass fiber or 1-20 thicknesses of a photovoltaic material stacked on each other in the high-energy neutron flux and measuring a voltage or signal produced when a neutron of the high-energy neutron flux of neutrons undergoes a nuclear reaction with the photovoltaic material or when a neutron of the high-energy neutron flux undergoes a nuclear reaction with Si of the glass fiber, wherein the photovoltaic material comprises any one or any combination of the following Ba, As, Br, C, Ce, Cl, Co, Cu, F, Ga, Ge, In, Cd, Te, Al, P, K, La, Mo, Nd, O, Os, Pr, S, Se, Si, Sn, Sr, Ti, Tl, V, Zn, and Zr.

6. The method of claim 5, wherein the photovoltaic material has a window for receiving neutrons at an end and a length of the photovoltaic material perpendicular to the window is greater than a height and a width of the window.

7. The method of claim 6, wherein the length is 6-60, 7-50, or 5-40 cm, and the detector comprises a γ-ray filter.

8. The method of claim 7, wherein the nuclear reaction produces ionizing radiation, and the detector measures a voltage or a signal produced by the ionizing radiation.

* * * * *

UNITED STATES PATENT AND TRADEMARK OFFICE
CERTIFICATE OF CORRECTION

PATENT NO. : 12,147,002 B2
APPLICATION NO. : 17/146292
DATED : November 19, 2024
INVENTOR(S) : Ian Shawn Horvath et al.

It is certified that error appears in the above-identified patent and that said Letters Patent is hereby corrected as shown below:

In the Claims

At Column 75, Line 30, In Claim 1:
"A neutron detector comprising a case with an opening,"
Should read:
--A neutron detector comprising: a case with an opening,--

At Column 75, Lines 39 and 40, In Claim 1:
"wherein, when the neutron detector is in the live state, one or more of the first photovoltaic sheet has a non-zero"
Should read:
--wherein, when the neutron detector is in the live state, the first photovoltaic sheet has a non-zero--

Signed and Sealed this
Eleventh Day of February, 2025

Coke Morgan Stewart
*Acting Director of the United States Patent and Trademark Office*